(12) United States Patent  
Sasaki

(10) Patent No.: US 7,701,553 B2  
(45) Date of Patent: Apr. 20, 2010

(54) SURFACE LEVEL DETECTION METHOD, EXPOSURE APPARATUS, AND DEVICE MANUFACTURING METHOD

(75) Inventor: Ryo Sasaki, Utsunomiya (JP)

(73) Assignee: Canon Kabuhsiki Kaisha, Tokyo (JP)

( * ) Notice: Subject to any disclaimer, the term of this patent is extended or adjusted under 35 U.S.C. 154(b) by 400 days.

(21) Appl. No.: 11/846,996

(22) Filed: Aug. 29, 2007

(65) Prior Publication Data

US 2009/0009738 A1      Jan. 8, 2009

(30) Foreign Application Priority Data

Sep. 12, 2006   (JP)   .............................. 2006-247353

(51) Int. Cl.
*G03B 27/52*   (2006.01)
*G03B 27/42*   (2006.01)

(52) U.S. Cl. .......................................... 355/55; 355/53

(58) Field of Classification Search .................... 355/52, 355/53, 55, 77; 356/399–401; 250/548
See application file for complete search history.

(56) References Cited

U.S. PATENT DOCUMENTS

| 5,416,562 | A | * | 5/1995 | Ota et al. ....................... 355/53 |
| 5,825,043 | A |   | 10/1998 | Suwa ........................... 250/548 |
| 6,327,025 | B1 | * | 12/2001 | Imai ............................. 355/53 |
| 6,721,036 | B2 | * | 4/2004 | Scheiberlich et al. ......... 355/53 |
| 6,876,435 | B2 |   | 4/2005 | Kataoka et al. ............... 355/53 |
| 6,924,884 | B2 | * | 8/2005 | Boonman et al. ............. 355/55 |
| 7,206,058 | B2 |   | 4/2007 | Modderman et al. .......... 355/55 |
| 2006/0176459 | A1 |   | 8/2006 | Modderman et al. .......... 355/55 |

FOREIGN PATENT DOCUMENTS

| EP | 0 834 773 A2 | 4/1998 |
| JP | 10-284393 | 10/1998 |
| JP | 11-186129 | 7/1999 |
| JP | 2002-334826 | 11/2002 |
| KR | 1998-32589 | 7/1998 |
| WO | WO 2004/003469 | 1/2004 |

OTHER PUBLICATIONS

Korean Office Action dated Dec. 22, 2008, issued in corresponding Korean patent application No. 10-2007-0091866.

* cited by examiner

*Primary Examiner*—Hung Henry Nguyen
(74) *Attorney, Agent, or Firm*—Fitzpatrick, Cella, Harper & Scinto

(57) ABSTRACT

A wafer surface level detection method includes a first level measurement step of measuring a level of a surface of a substrate having a plurality of shot regions, a position measurement step of measuring a position along the surface of the substrate, a first movement step of moving the substrate in at least a vertical direction on the basis of the measurement result obtained in the first level measurement step and the measurement result obtained in the position measurement step, and a second level measurement step of measuring the level of the surface of the substrate after the first movement step, wherein each of the plurality of shot regions has a measurement region. In the first movement step, the substrate is moved such that a relative position of the measurement region of each of the plurality of shot regions and each of the plurality of shot regions along the surface is constant, and, in the second level measurement step, the measurement region of each of the plurality of shot regions is measured.

6 Claims, 26 Drawing Sheets

SURFACE LEVEL DETECTION METHOD, EXPOSURE APPARATUS, AND DEVICE MANUFACTURING METHOD

This application claims the benefit of Japanese Patent Application No. 2006-247353, filed Sep. 12, 2006, which is hereby incorporated by reference herein in its entirety.

BACKGROUND OF THE INVENTION

1. Field of the Invention

The present invention relates to a surface level detection method, an exposure apparatus, and a device manufacturing method.

2. Description of the Related Art

The recent shortening of the wavelength of light used for an exposure apparatus (to be referred to as exposure light, hereafter) has improved the resolution of an exposure apparatus. Along with such a trend, a demand has arisen for enhancing the accuracy of detecting the surface level of a wafer to be exposed (the accuracy of executing a focus measurement).

Normally, a sensor for detecting the wafer surface level is positioned on the forward side of an exposure slit. Using the sensor, the wafer surface level is detected (measurement process is executed) immediately before an exposure process. A wafer stage is controlled at an exposure position such that the wafer surface level coincides with the focal plane of a projection lens.

To accurately detect (measure) the wafer surface level, it is desirable to measure a large number of measurement points on the wafer surface at a very narrow pitch. In such a circumstance, the throughput of an exposure step, including a measurement process and an exposure process, may decrease due to an increase in measurement time.

To prevent this problem, a twin-stage type exposure apparatus is proposed, which comprises a first wafer stage on which a wafer is exposed and a second wafer stage on which a wafer is measured. The first wafer stage is arranged in an exposure station, while the second wafer stage is arranged in a measurement station. In the measurement station, a focus detection system for detecting the wafer surface level, and an alignment detection system for measuring the alignment position of a wafer exposure region are set. The twin-stage type exposure apparatus can measure a wafer in the measurement station, while exposing another wafer in the exposure station in parallel. Doing so makes it possible to simultaneously improve the accuracy of detecting the wafer surface level and the exposure step throughput (for a plurality of wafers).

The focus detection system of the twin-stage type exposure apparatus generally adopts a focal plane detection unit for detecting a focal plane of exposure light. The focal plane detection unit causes a light-projecting system to obliquely irradiate a target detection surface (wafer surface) with a slit-like light beam from above. Then, a slit-like optical image (to be referred to as a slit image hereafter) is formed on the target detection surface. The light beam reflected by the target detection surface is guided to re-form a slit image on a light-receiving system (e.g., a CCD area sensor). The re-formed slit image will be called a target detection image hereafter. The light-receiving system monitors the position of the target detection image thereon. With this operation, the position of the target detection image formed on the light-receiving system changes as the target detection surface (wafer surface) is displaced vertically. The focal plane detection unit detects the wafer surface level by monitoring the position of the target detection image formed on the light-receiving system.

There is a case when an error caused upon detecting the wafer surface level by the light-receiving system may increase. Assume, for example, that a thin film, such as a photoresist, adheres to the wafer surface. A light beam, obtained by interference between light reflected by the surface of the thin film and light transmitted through it and reflected by the wafer surface, may form an image on the light-receiving system. Such a circumstance increases an error caused upon detecting the wafer surface level by the light-receiving system.

Under such a circumstance, Japanese Patent Laid-Open No. 2002-334826 proposed the following technique. That is, the light-receiving system moves to a position along the wafer surface, which is determined using layout information, to detect the surface level at the position. An offset is then calculated from the detected value to correct, based on the calculated offset, the detection result (focus measurement value) obtained by the light-receiving system.

However, the technique disclosed in Japanese Patent Laid-Open No. 2002-334826 does not consider the fact that the relative positions, each of which is of a focus measurement region relative to a target measurement region in a shot region, are displaced among shot regions. This fact makes it impossible to correctly calculate an offset for correcting a focus measurement value. The target measurement region means a region on the focal plane, where a slit image is desirably formed, and which has a constant relative position to each shot region along the surface. The focus measurement region means a region where a slit image is actually formed. Therefore, it may be impossible to accurately detect the wafer surface level.

Assume, for example, that a slit image is formed on a focus measurement region MA1 spaced apart from a target measurement region OA in a shot region SAa, as shown in FIG. 24. The focus measurement region MA1 exists on a first horizontal plane HP1 and on the surface of a thin layer 5a. That is, when the focal plane detection unit irradiates the focus measurement region MA1 with a light beam LF1, the light-receiving system receives a light beam LF2 reflected by the surface of the thin layer 5a and a light beam LF3 reflected by the interface of a high-reflectance layer 5c. The intensity of light applied to the light-receiving system exhibits a distribution as indicated by a waveform DW1. Specifying the position of a target detection image at a peak position DP1 of the waveform DW1 makes it possible to detect the vertical position of a wafer WF.

Assume, for example, that a slit image is formed on a focus measurement region MA2 in a shot region SAb, as shown in FIG. 25. The positions of the focus measurement regions MA1 and MA2 relative to the target measurement region OA are displaced along the surface by ER1. Both the focus measurement regions MA1 and MA2 exist on the first horizontal plane HP1. The relative positions of the focus measurement regions MA1 and MA2 relative to the target measurement region OA are not displaced in the vertical direction. That is, when the focal plane detection unit irradiates the focus measurement region MA2 with the light beam LF1, the light-receiving system receives a light beam LF4 reflected by the surface of the thin layer 5a and a light beam LF5 reflected by the interface of a low-reflectance layer 5b. The intensity of light imaged on the light-receiving system exhibits a distribution, as indicated by a waveform DW2. The intensity of the light beam LF5 is lower than the intensity of the light beam LF3 (see FIG. 24). Specifying the position of a target detection image at a peak position DP2 of the waveform DW2 causes a displacement ER2 from the peak position DP1. It is, therefore, impossible to correctly calculate an offset between the shot regions SAa and SAb. Such a circumstance leads to a failure in accurate detection of the vertical position of the wafer WF.

Assume that a slit image is formed on a focus measurement region MA3 in a shot region SAc, as shown in FIG. 26. The relative positions of the focus measurement regions MA1 and MA3 relative to the target measurement region OA are displaced along the surface by ER1 and in the vertical direction by ER3. The focus measurement region MA3 exists on a second horizontal plane HP2 spaced apart from the first horizontal plane HP1 by the distance ER3. That is, when the focal plane detection unit irradiates the focus measurement region MA3 with the light beam LF1, the light-receiving system receives a light beam LF6 reflected by the surface of the thin layer 5a and a light beam LF7 reflected by the interface of the low-reflectance layer 5b. The intensity of light imaged on the light-receiving system exhibits a distribution as indicated by a waveform DW3. The intensity of the light beam LF7 is lower than the intensity of the light beam LF3 (see FIG. 24). Specifying the position of a target detection image at a peak position DP3 of the waveform DW3 causes a displacement ER4 from the peak position DP1. It is, therefore, impossible to correctly calculate an offset between the shot regions SAa and SAc. Such a circumstance leads to a failure in accurate detection of the vertical position of the wafer WF.

SUMMARY OF THE INVENTION

It is an object of the present invention to provide a surface level detection method capable of accurately detecting the wafer surface level, an exposure apparatus, and a device manufacturing method.

According to a first aspect of the present invention, a surface level detection method comprises a first level measurement step of measuring a level of a surface of a substrate having a plurality of shot regions, a position measurement step of measuring a position along the surface of the substrate, a first movement step of moving the substrate in at least a vertical direction on the basis of the measurement result obtained in the first level measurement step and the measurement result obtained in the position measurement step, and a second level measurement step of measuring the level of the surface of the substrate after the first movement step, wherein each of the plurality of shot regions has a measurement region, wherein, in the first movement step, the substrate is moved such that a relative position of the measurement region of each of the plurality of shot regions and each of the plurality of shot regions along the surface is constant, and wherein, in the second level measurement step, the measurement region of each of the plurality of shot regions is measured.

According to a second aspect of the present invention, a surface level detection method comprises a first level measurement step of measuring a level of a surface of a substrate having a plurality of shot regions, a position measurement step of measuring a position along the surface of the substrate, a first movement step of moving the substrate in at least a vertical direction on the basis of the measurement result obtained in the first level measurement step and the measurement result obtained in the position measurement step, and a second level measurement step of measuring the level of the surface of the substrate after the first movement step, wherein each of the plurality of shot regions has a measurement region, wherein, in the first movement step, the substrate is moved such that a relative position of the measurement region of each of the plurality of shot regions and a focal plane in the vertical direction is constant, and wherein, in the second level measurement step, the measurement region of each of the plurality of shot regions is measured.

According to a third aspect of the present invention, a surface level detection method comprises a storage step of storing correlation information indicating a correlation between a relative position of a measurement region, wherein a level of a surface of a substrate is measured, relative to a shot region along the surface and a measurement error of the level of the surface, a first level measurement step of measuring the level of the surface of the substrate, a position measurement step of measuring a position along the surface of the substrate, and a correction step of correcting the measurement result obtained in the first level measurement step, on the basis of the correlation information and a relative position of a region, wherein the level of the surface is measured in the first level measurement step, relative to the shot region along the surface.

According to a fourth aspect of the present invention, a surface level detection method is provided, for detecting, by a focus detection system, a level of a surface of a substrate including a first measurement region and a second measurement region juxtaposed in a scanning direction of the substrate. The method includes a fourth level measurement step of measuring the level of the surface of the substrate in the first measurement region, a movement step of moving the substrate in a vertical direction on the basis of the measurement result obtained in the fourth level measurement step, and a fifth level measurement step of measuring the level of the surface of the substrate in the second measurement region after the movement step, wherein, in the movement step, the substrate is moved such that a relative position of the second measurement region and a focal plane in the vertical direction is constant.

According to a fifth aspect of the present invention, an exposure apparatus comprises an optical system to project exposure light applied to a mask on which a pattern is formed onto a substrate, and a positioning apparatus to support and to position the substrate using a surface level detection method defined in any one of the first through fourth aspects of the present invention.

According to the present invention, it is possible to accurately detect the wafer surface level.

Further features of the present invention will become apparent from the following description of exemplary embodiments, with reference to the attached drawings.

DESCRIPTION OF THE EMBODIMENTS

Figure 1:
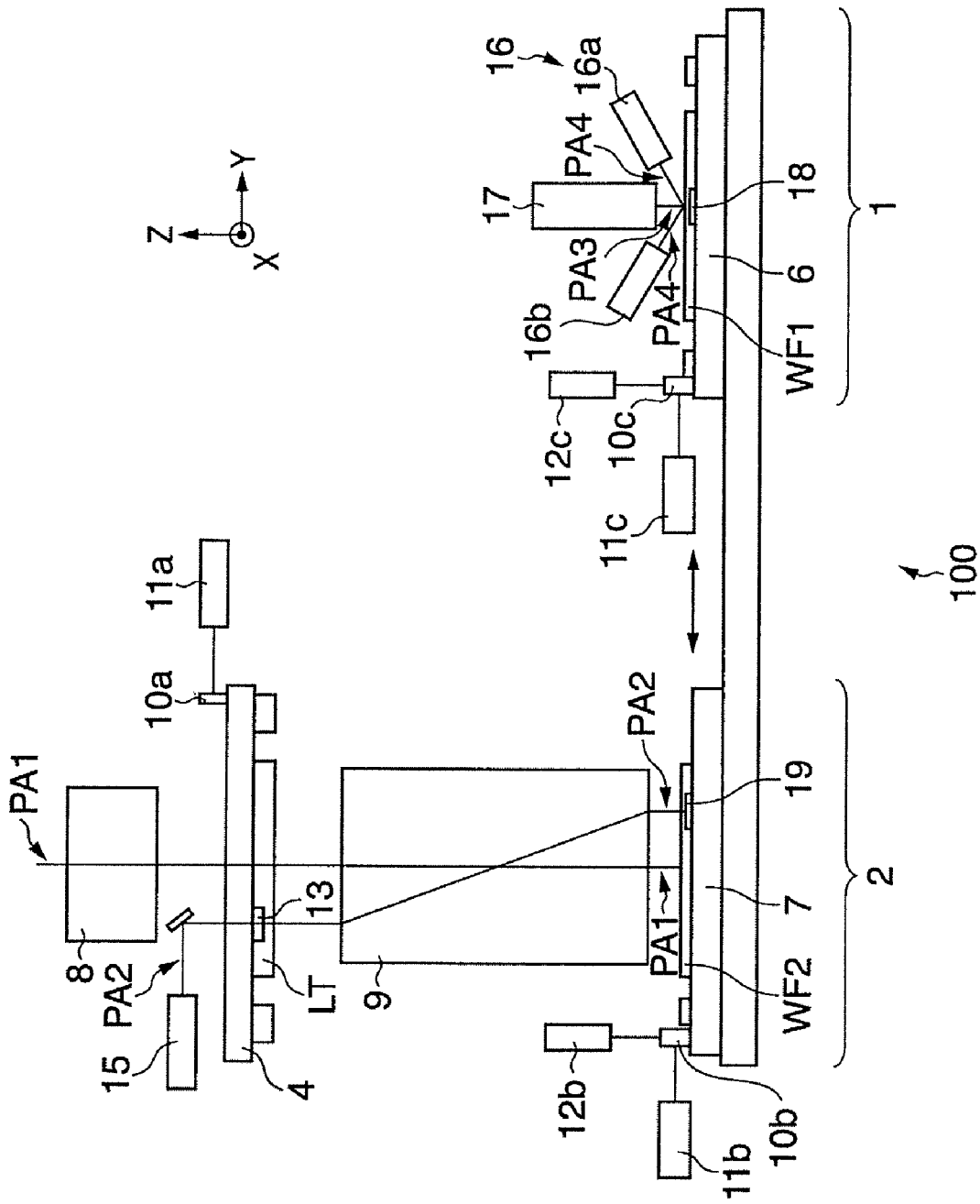
FIG. 1 is a view showing the arrangement of an exposure apparatus according to the first embodiment.

An exposure apparatus according to the first embodiment of the present invention will be explained with reference to FIG. 1. FIG. 1 is a view showing the arrangement of the exposure apparatus according to the first embodiment. The first embodiment will exemplify a scanning exposure apparatus (scanning stepper) as the exposure apparatus. The scanning exposure apparatus is an apparatus for exposing a wafer by projecting the pattern drawn on a reticle (mask) LT onto the wafer (substrate) WF2 (or the wafer WF1), while synchronously moving them in the scanning direction. In the following description, a direction away from the wafer WF2 in a first optical axis PA1 is defined as the +Z direction. A direction (scanning direction), in which the reticle LT and wafer WF2 (or wafer WF1) move in synchronism with each other in a plane perpendicular to the Z and Y directions, is defined as the X direction. The rotation directions about the X-, Y-, and Z-axes are defined as the θX, θY, and θZ directions, respectively.

The schematic arrangement and operation of the exposure apparatus will be described first.

An exposure apparatus 100 is of a twin-stage type. The exposure apparatus 100 comprises a measurement station 1, an exposure state 2, a reticle stage 4, a wafer stage (positioning apparatus) 6, a wafer stage (positioning apparatus) 7, an illumination optical system 8, a projection optical system 9, mirrors 10a to 10c, first laser interferometers 11a to 11c, second laser interferometers 12b and 12c, a reticle alignment detection system 15, a focus detection system 16, a wafer alignment detection system 17, and a controller (not shown).

The exposure station 2, reticle stage 4, wafer stage 7, illumination optical system 8, projection optical system 9, mirrors 10a and 10b, first laser interferometers 11a and 11b, and second laser interferometers 12b, are arranged such that the first optical axis PA1 serves as the center thereof. The first optical axis PA1 indicates a direction in which the principal ray of exposure light travels from a light source (not shown) to the wafer WF2. The reticle alignment detection system 15 is arranged such that a second optical axis PA2 serves as the center thereof. The second optical axis PA2 indicates a direction in which the principal ray of alignment light travels from the reticle alignment detection system 15 to the wafer WF2. On the other hand, the measurement station 1, wafer stage 6, mirror 10c, first laser interferometer 11c, second laser interferometer 12c, focus detection system 16, and wafer alignment detection system 17 are arranged far from the first optical axis PA1.

The wafer stages 6 and 7 are configured to be movable between the measurement station 1 and the exposure station 2, and the positions thereof are interchangeable. The wafer stage 6 holds the wafer WF1, while the wafer stage 7 holds the wafer WF2. In the measurement station 1, the wafer WF1 undergoes a shot alignment process and a surface level measurement process (a process using a surface level detection method). In the exposure station 2, the wafer WF2 is exposed. Doing so makes it possible to simultaneously execute the measurement process of the wafer WF1 and the exposure process of the wafer WF2. When the positions of the wafer stages 6 and 7 are then interchanged, the wafer WF1 is exposed.

The mirrors 10b and 10c are provided on the wafer stage 6 and 7. The first laser interferometers 11b and 11c and second laser interferometers 12b and 12c are opposite to the mirrors 10b and 10c. The first laser interferometers 11b and 11c measure the positions of the wafer stage 6 and 7 in the X and Y directions and the rotation angles thereof in the θZ direction, in real time, and output the measurement results to the controller. In addition, the second laser interferometers 12b and 12c measure the positions of the wafer stages 6 and 7 in the Z direction and the rotation angles thereof in the θX and θY directions, in real time, and output the measurement results to the controller. On the basis of the measurement results obtained by the first laser interferometers 11b and 11c and second laser interferometers 12b and 12c, the controller drives the wafer stages 6 and 7 to position the wafer WF1 and WF2. With the present operation, the wafer stages 6 and 7 move in the X, Y or Z direction or rotate in the θX, θY, or θZ direction, while supporting the wafers WF1 and WF2.

Via the projection optical system 9, the reticle stage 45 is located in the +Z direction with respect to the wafer stage 7. With the present arrangement, the projection optical system 9, by projecting light guided via the reticle LT onto the wafer WF2, exposes the wafer to form, on the wafer WF2, an image corresponding to the pattern drawn on the reticle LT.

The projection optical system 9 includes a plurality of optical devices, which are configured to expose a wafer by projecting the pattern of the reticle LT onto the wafer WF2 at a predetermined projection magnification β. A lens barrel made of a metal member supports the optical devices. Examples of the projection magnification β are ¼ and ⅕.

The illumination optical system 8 is located in the +Z direction with respect to the reticle stage 4. With the present arrangement, the illumination optical system 8 illuminates the illumination region of the reticle LT with exposure light having a uniform illuminance distribution. The exposure light is diffracted by the pattern drawn on the reticle LT, and guided to the projection optical system 9.

The mirror 10a is provided on the reticle stage 4. The first laser interferometer 11a opposes the mirror 10a. The first laser interferometer 11a measures, in the real time, the position, in the X and Y directions, and the rotation angle, in the OZ direction, of the reticle LT mounted on the reticle stage 4. The first laser interferometer 11a outputs the measurement result to the controller. On the basis of the measurement result, the controller drives the reticle stage 4 to position the reticle LT. With the present operation, the reticle stage 4 moves in the X or Y direction, or rotates in the OZ direction, while supporting the reticle LT.

A reticle reference mark 13 is formed on the reticle stage 4. The reticle alignment detection system 15 is located in the +Z direction with respect to the reticle reference mark 13. The reticle alignment detection system 15 uses measurement light having the same wavelength as the wavelength of exposure light to actually expose the wafer WF2. A reticle alignment detection system reference mark 19 is formed on a stage reference plate 14 (see FIG. 4) of the wafer stage 7 in the −Z direction with respect to the reticle reference mark 13. The reticle alignment detection system reference mark 19 is a reflective mark herein. Light applied from the reticle alignment detection system 15 travels in the −Z direction along the second optical axis PA2, and reaches the reticle alignment detection system reference mark 19. The reflected light travels in the +Z direction along the second optical axis PA2, and reaches the reticle alignment detection system 15. Doing so makes it possible to detect a focal shift (a displacement in the Z direction from the focal plane) between the reticle reference mark 13 and the reticle alignment detection system reference mark 19, to allow the positioning between the reticle LT and the wafer WF2.

Figure 4:
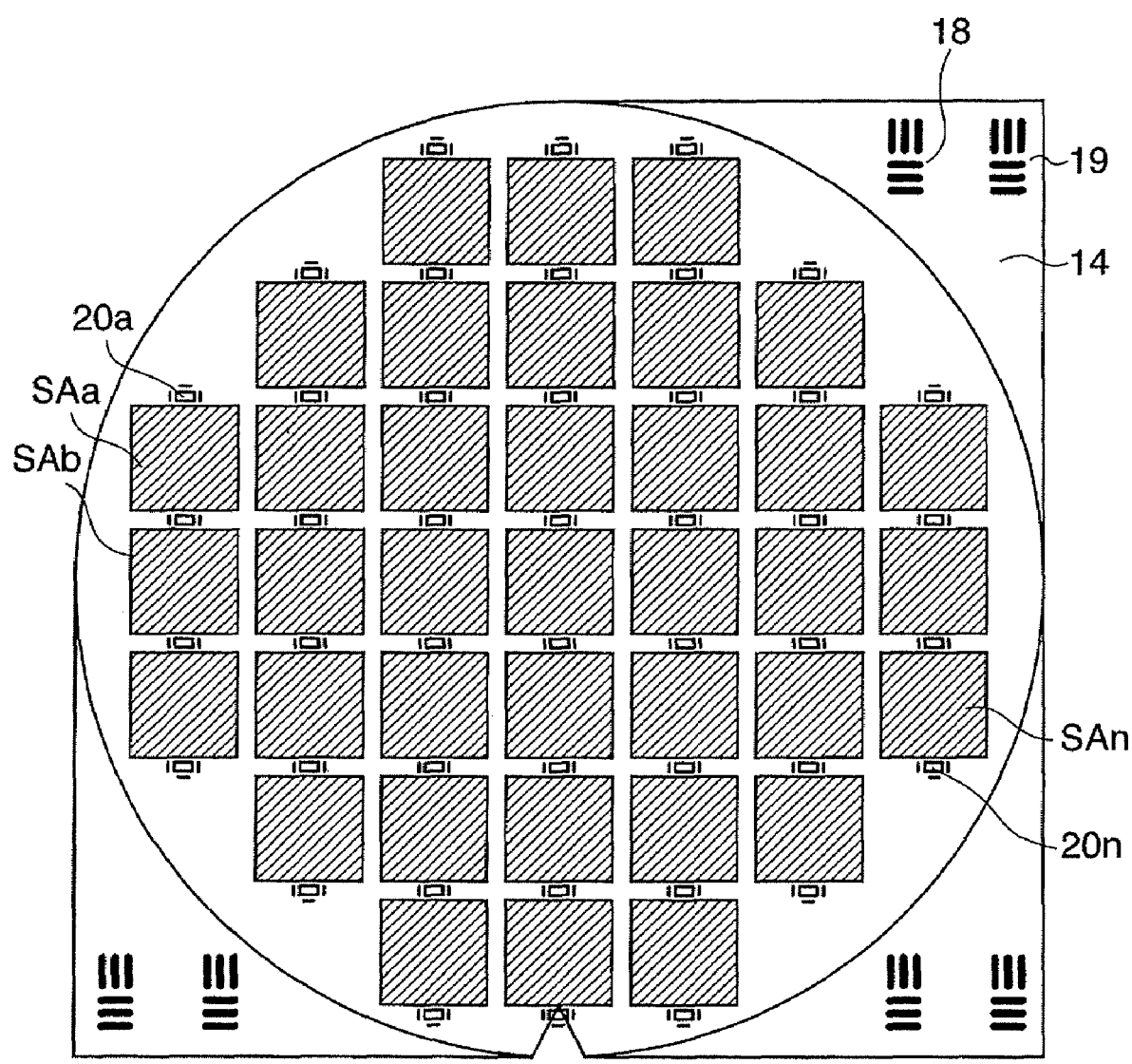
FIG. 4 is a view showing shot regions and wafer alignment marks.

The reticle alignment detection system reference mark 19 is also formed on the stage reference plate 14 of the wafer stage 6 (see FIG. 4). On each of the stage reference plates 14 of the wafer stages 6 and 7, a wafer alignment detection system reference mark 18 is formed adjacent to the reticle alignment detection system reference mark 19. The wafer alignment detection system reference mark 18 is a reflective mark herein. The positional relationship between the wafer alignment detection system reference mark 18 and the reticle alignment detection system reference mark 19 is known.

The wafer alignment detection system 17 is located in the +Z direction with respect to the wafer alignment detection system reference mark 18. With the preset arrangement, light applied from the wafer alignment detection system 17 travels in the −Z direction along a third optical axis PA3, and reaches the wafer alignment detection system 17. Doing so makes it possible to detect the position of the wafer alignment detection system reference mark 18 in the X and Y directions, to allow the detection of the position (alignment position) of the wafer WF1 in the X and Y directions.

The focus detection system 16 includes a light-projecting system 16a and a light-receiving system 16b. The light-projecting system 16a and light-receiving system 16b are provided obliquely above the wafer alignment detection system reference mark 18 to oppose each other. Light applied from the light-projecting system 16a travels in the −Y direction along a fourth optical axis PA4, forms a slit image on the wafer alignment detection system reference mark 18, and is reflected thereby. The reflected light travels in the −Y direction along the fourth optical axis PA4, and re-forms a slit image on the light-receiving system 16b. Doing so makes it possible to measure the position of the wafer alignment detection system reference mark 18 in the Z direction to allow the detection of the position (surface level) of the wafer WF1 in the Z direction.

Figure 2:
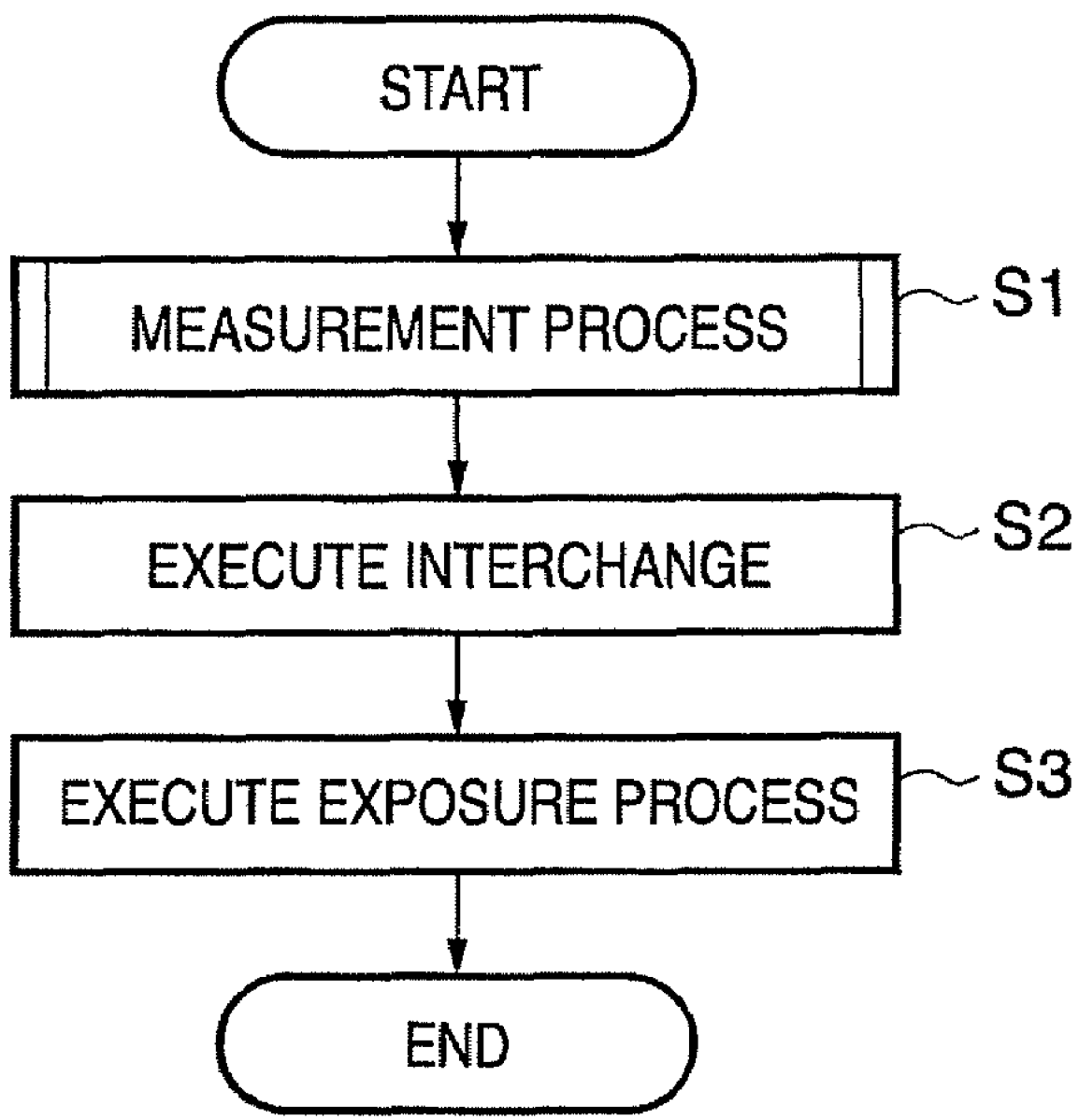
FIG. 2 is a flowchart illustrating a sequence of exposure steps performed by the exposure apparatus.

A sequence of exposure steps performed by the exposure apparatus will be described with reference to FIG. 2. FIG. 2 is a flowchart illustrating a sequence of an exposure process performed by the exposure apparatus. Although the wafer WF1 loaded on the wafer stage 6 will be mainly explained below, the same applies to other wafers.

In step S1, the exposure apparatus executes a measurement process for measuring the wafer WF1. Details of the measurement process will be described hereafter.

In step S2, the exposure apparatus interchanges the wafer stage 6, arranged in the measurement station 1, and the wafer stage 7, arranged in the exposure station 2. With the present operation, the wafer stage 7 is arranged in the measurement station 1, while the wafer stage is arranged in the exposure station 2. That is, the measured wafer WF1 is transferred to the exposure station 2 via the wafer stage 6, while the exposed wafer WF2 is returned to the measurement station 1 via the wafer stage 7. The wafer WF2 is then removed from the wafer stage 7 and transferred to the next processing apparatus, and a new wafer is loaded on the wafer stage 7.

In step S3, the exposure apparatus executes an exposure process for exposing the wafer WF1. That is, the reticle alignment detection system 15 measures the wafer alignment detection system reference mark 18, and outputs the measurement result to the controller (not shown). On the basis of the measurement result and the coordinate information of shot regions SAa to SAn statistically calculated by global alignment, the controller calculates the exposure positions thereof (in the X and Y directions).

The reticle alignment detection system 15 measures the reticle alignment detection system reference mark 19, and outputs the measurement result to the controller. On the basis of the measurement result, the controller generates a control signal for controlling operation to drive the wafer stage 6, such that the surface of the stage reference plate 14 matches the focal plane of the projection optical system 9. On the basis of error information, the controller changes the control signal to correct a position for controlling operation to drive the wafer stage 6. The controller controls operation to drive the wafer stage using the changed control signal. The error information herein means the relationship between the position of the surface of the wafer WF1 in the X and Y directions and an error upon detecting its position to accurately match the surface level of the wafer WF1 with the focal plane of the projection optical system 9.

In a like manner, for each of the shot regions SAa to SAn (see FIG. 4), the controller executes exposure by controlling operation to drive the wafer stage 6 such that the surface level of the wafer WF1 matches the focal plane of the projection optical system 9.

Figure 3:
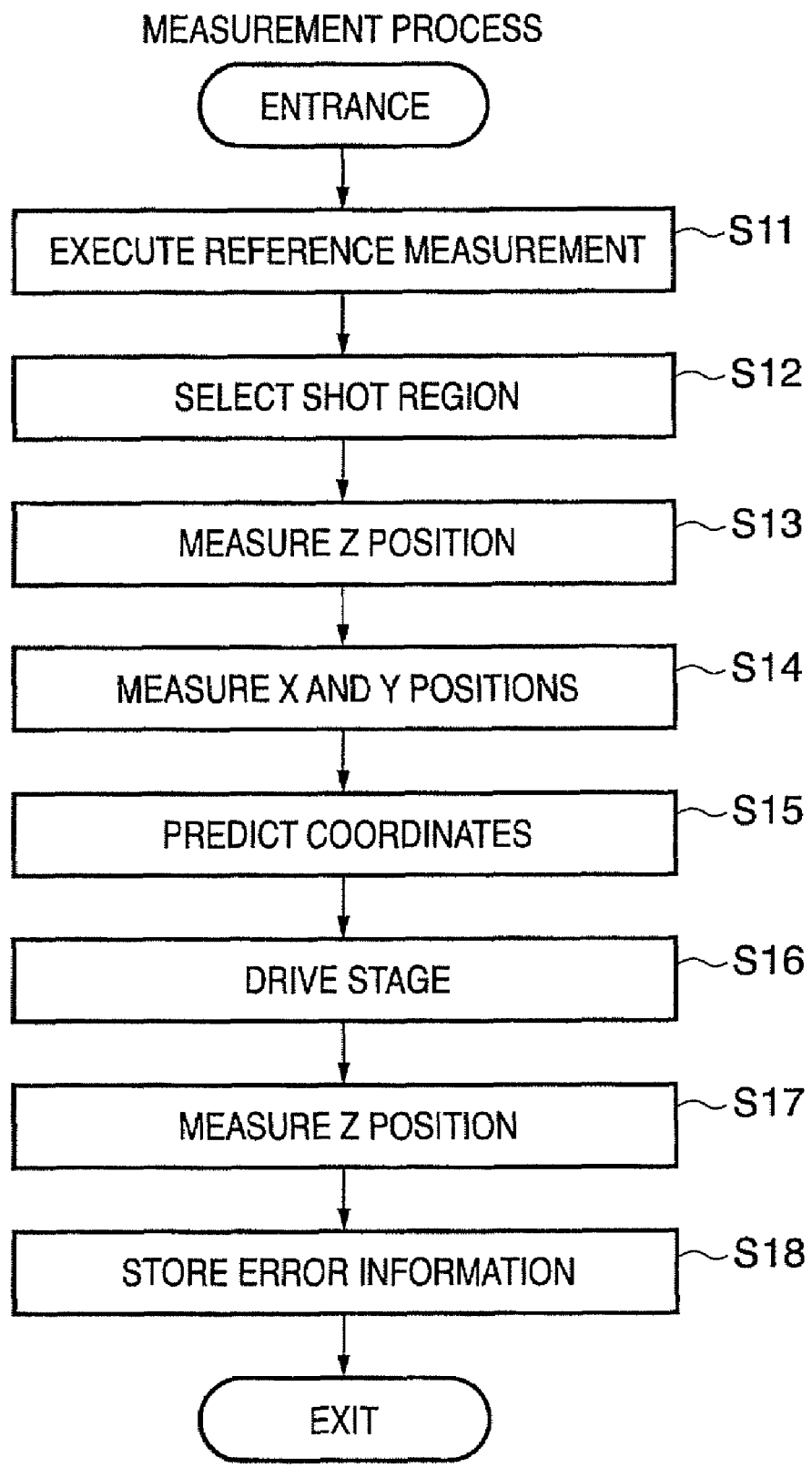
FIG. 3 is a flowchart illustrating a sequence of a measurement process.

A sequence of measurement processes will be described with reference to FIG. 3. FIG. 3 is a flowchart illustrating a sequence of the measurement process.

In step S11, after the wafer WF1 is transferred to the measurement station 1, the wafer alignment detection system 17 measures the position of the wafer alignment detection system reference mark 18 in the X and Y directions as an alignment reference measurement. The wafer alignment detection system 17 outputs the measurement result to the controller. The controller stores the measurement result (the position of the wafer alignment detection system reference mark 18 in the X and Y directions).

The focus detection system 16 measures the position of the wafer alignment detection system reference mark 18 in the Z direction as a focus reference measurement, and outputs the measurement result to the controller. The controller stores the measurement result (the position of the wafer alignment detection system reference mark 18 in the Z direction).

In step S12, the controller selects a plurality of regions from the shot regions SAa to SAn of the wafer WF1. The controller specifies wafer alignment marks 20a to 20n (see FIG. 4) respectively corresponding to the plurality of selected shot regions SAa to SAn. The controller sends the information about the plurality of specified wafer alignment marks 20a to 20n to the focus detection system 16 and wafer alignment detection system 17.

Figure 5:
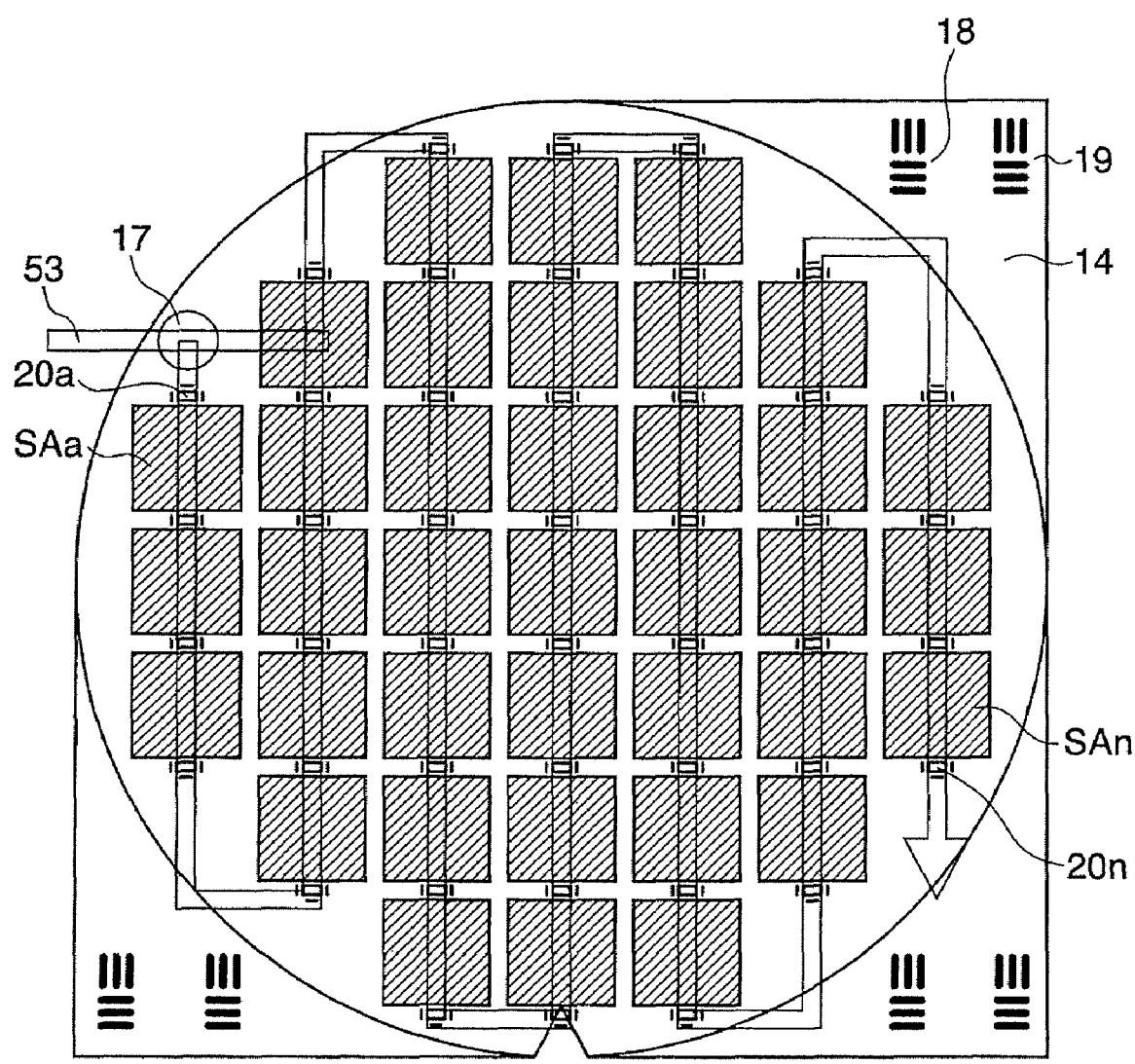
FIG. 5 is a view showing shot regions and wafer alignment marks.

In step S13 (first level measurement step), the focus detection system 16 measures the positions, in the Z direction, of the plurality of wafer alignment marks 20a to 20n selected in step S12, and outputs the measurement result to the controller (see FIG. 5). The controller stores the measurement result (the positions of the wafer alignment marks 20a to 20n in the Z direction).

In step S14 (position measurement step), the wafer alignment detection system 17 measures the positions of the wafer alignment marks 20a to 20n in the X and Y directions as global alignment, and outputs the measurement result to the controller. The controller stores the measurement result (the positions of the wafer alignment marks 20a to 20n in the X and Y directions).

Meanwhile, during the interval between steps S13 and S14, the controller may determine whether a Z position is displaced from the focal plane by a predetermined value or more. If the controller determines that the Z position is displaced from the focal plane by the predetermined value or more, it controls operation to drive the wafer stage 6 in the Z direction to match the focal plane. Hence, the wafer alignment detection system 17 can execute measurement in step S14, while reducing the influence of the telecentricity of the optical system.

In step S15, on the basis of the measurement result obtained in step S14, the controller calculates the distance from the wafer alignment detection system reference mark 18 to each of the measured wafer alignment marks 20a to 20n. The controller statistically predicts the coordinates of the shot regions SAa to SAn on the basis of the distance information. The larger the number of measured wafer alignment marks of the wafer alignment marks 20a to 20n, the higher the prediction accuracy of the coordinates of the shot regions SAa to SAn. The higher the measurement accuracy for every one of the wafer alignment marks 20a to 20n, the higher the prediction accuracy of the coordinates of the shot regions SAa to SAn. Such information improves the alignment accuracy in an exposure step (see FIG. 2).

In step S16 (movement step), the controller controls operation to drive the wafer stage 6, such that the position of a focus measurement region relative to a target measurement region is constant. The target measurement region herein means a region on the focal plane, where a slit image (e.g., the slit image SL shown in FIG. 6) is desirably formed, and which is constant relative to each of the shot regions SAa to SAn along the X and Y directions (along the surface). A focus measurement region 53 (see FIG. 6) means a region where a slit image (e.g., the slit image SL shown in FIG. 6) is actually formed.

That is, the controller moves the wafer WF1 such that the position of a focus measurement region relative to each of the plurality of shot regions SAa to SAn in the X and Y directions is constant. Alternatively, the controller moves the wafer WF1 such that the position of a focus measurement region relative to the focal plane in the Z direction is constant among the plurality of shot regions SAa to SAn.

If the position of the focus measurement region relative to each of the shot regions SAa to SAn in the X and Y directions changes, the focus detection system 16 may generate a measurement error. In other words, if the position of the focus measurement region relative to the pattern of, e.g., an interconnection or an insulator in each shot region in the X and Y directions changes, the focus detection system 16 may generate a measurement error.

To prevent this problem, the present invention determines accurate X and Y positions (coordinates) of each of the shot regions SAa to SAn to control operation such that the position of the focus measurement region relative to each of the shot regions SAa to SAn in the X and Y directions is constant.

Figure 6:
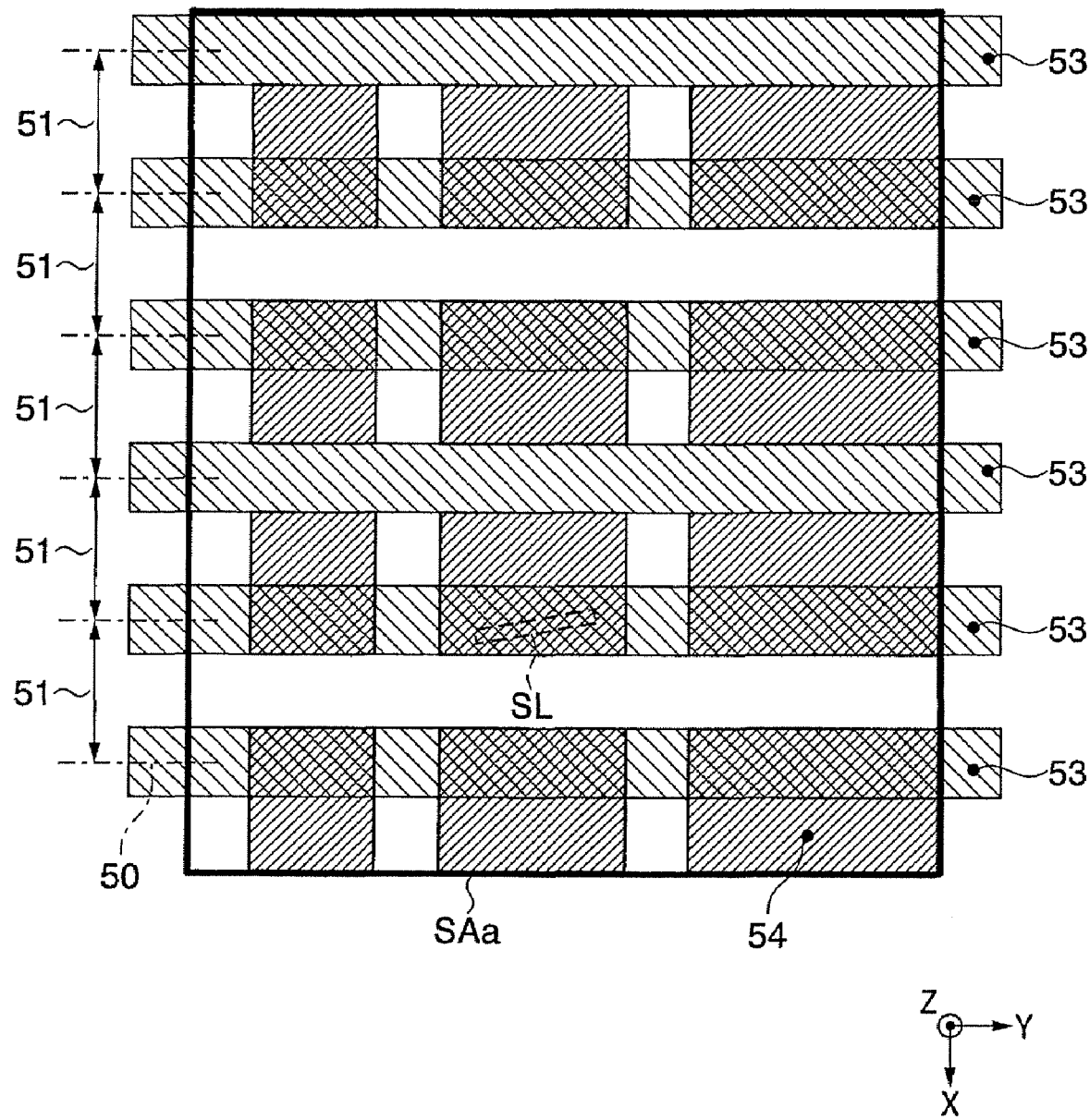
FIG. 6 is a view showing focus measurement regions.

For example, as shown in FIG. 6, before focus measurement (position measurement in the Z direction) for each selected shot region SAa, the controller sets a plurality of focus measurement regions 53 in each shot region SAa, which can be simultaneously measured in the X direction. The focus detection system 16 receives the information about the plurality of focus measurement regions 53 from the controller. On the basis of the information about the plurality of focus measurement regions 53, the focus detection system 16 executes focus measurement (position measurement in the Z direction), with sampling at a desired measurement pitch 51 (see FIG. 6), in the X direction. The focus detection system 16 outputs the measurement result to the controller. The measurement pitch 51 here means the interval between center lines 50 of adjacent focus measurement regions 53. The controller determines a shot region SAa and the corresponding focus measurement region 53 thereof on the basis of the measurement result. Then, the controller determines a focus measurement region corresponding to the pattern of, e.g., an interconnection or an insulator in the shot region SAa, e.g., a focus measurement region 53 corresponding to a high-reflectance portion 54 of the pattern of, e.g., an interconnection or an insulator.

The controller controls operation to drive the wafer stage 6, such that the relative position (the distance in the X and Y directions) between the shot region SAa and the focus measurement region 53 in the X and Y directions is constant (i.e., identical to those for the other shot regions SAb to SAn).

Focus measurement is executed, while matching the position of the wafer stage 6 in the Z direction with the focus position of the wafer alignment mark 20a in each shot region SAa. Doing so allows focus measurement, such that even the relative position (the distance in the Z direction) between the focal plane and the focus measurement region 53 in the Z direction is constant for the other shot regions SAb to SAn.

It is also possible to obtain an X-Y distribution of Z height in the wafer surface by calculating the focus position of a wafer alignment mark in each shot using function approximation. The Z position (surface level) of the wafer stage during focus measurement for each shot region SAa is controlled on the basis of the X-Y distribution of the Z height in this wafer surface. Doing so makes it possible to make the relative position between a focus measurement region and a shot region in the X, Y, and Z directions identical to the relative position between a focus measurement region and another shot region in the X, Y, and Z directions.

In step S17 (second level measurement step), the focus detection system 16 measures the positions of the selected wafer alignment marks 20a to 20n in the Z direction (i.e., executes focus mapping), and outputs the measurement result to the controller (see FIG. 5). The controller stores the measurement result (the positions of the wafer alignment marks 20a to 20n in the Z direction).

In step S18, upon receiving the pieces of position information of the wafer alignment marks 20a to 20n from the wafer alignment detection system 17 and focus detection system 16, the controller calculates a component common to the shot regions SAa to SAn as a process offset. The controller determines the process offset as an error upon detecting a Z position. With the operation, the controller can specify information indicating the relationship between the position of the surface of the wafer WF1 in the X and Y directions, and the error upon detecting the Z position, i.e., error information. The controller stores the error information.

As described above, it is possible to set a position, where a slit image to measure a Z position is formed, almost identical to that in each of the shot regions SAa to SAn in the X and Y directions. Doing so makes it possible to accurately calculate a process offset as an error component common to the plurality of shot regions SAa to SAn, to accurately detect the wafer surface level.

Meanwhile, the exposure apparatus may comprise three or more wafer stages instead of the wafer stages 6 and 7.

The reticle stage 4 may be driven about one axis or six axes.

Stage reference plates 14 may be set at a plurality of corners of the wafer stages 6 and 7. A plurality of wafer alignment detection system reference marks 18 and a plurality of reticle alignment detection system reference marks 19 may be formed on one stage reference plate 14. The wafer alignment detection system reference mark 18 and reticle alignment detection system reference mark 19 may be the same.

All of the shot regions SAa to SAn may undergo steps S13 to S18 shown in FIG. 3. Even when an arrangement error of each shot region on the wafer surface is large, a focus measurement region corresponding to each shot region is uniquely determined for all the shot regions in the wafer surface, to be able to calculate the process offset of each shot region.

The controller may classify a plurality of shot regions into a plurality of groups, in accordance with an arrangement error of each shot region on the wafer surface, statistically process wafer alignment measurement values for each group, and calculate and store the position of each shot region.

In step S16, shown in FIG. 3, the controller may control operation to drive the focus detection system itself, such that the relative position between a target measurement region and a focus measurement region in the X, Y, and Z directions is constant among all the shot regions SAa to SAn.

Figure 7:
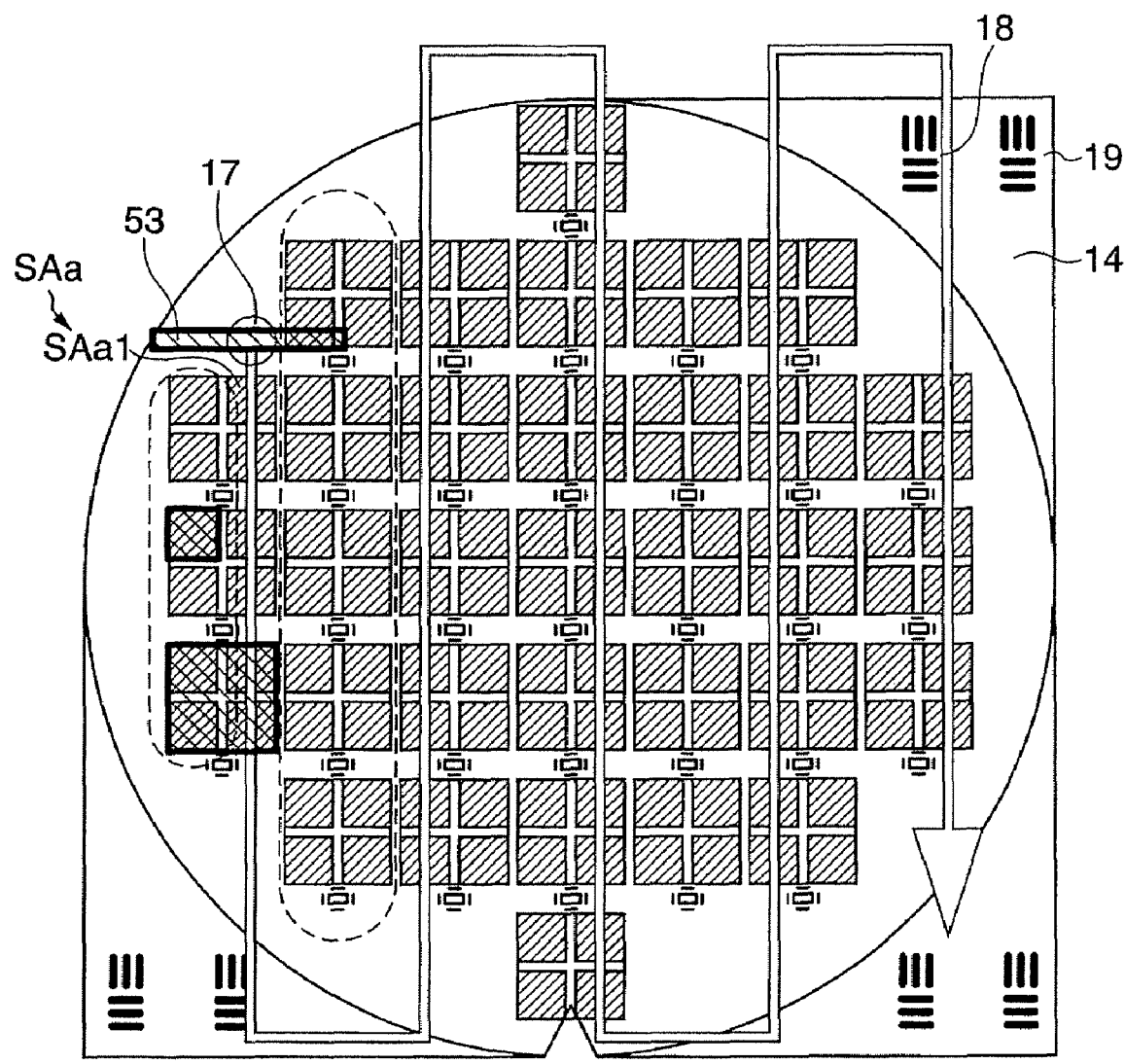
FIG. 7 is a view showing a case wherein the same patterns are repetitively formed in shot regions.

As shown in FIG. 7, when the same patterns are repetitively formed in shot regions, a plurality of shot regions may undergo focus measurement at the same time, instead of focus measurement for each shot region. For example, partial pattern SAa1 (the patterns of square regions indicated by a hatched portion) of the shot region SAa are repetitively formed at a portion surrounded by a broken line in FIG. 7. When the wafer alignment detection system 17 scans a column of the patterns SAa1 in focus measurement, it is possible to suppress a reduction in process offset calculation accuracy, even without scanning the portion surrounded by the broken line. For example, the wafer alignment detection system 17 scans seven columns shown in FIG. 5, while it scans only five columns shown in FIG. 7. This makes it possible to shorten the time taken for focus measurement by the wafer alignment detection system 17, to improve the throughput of measurement process. It is, therefore, possible to increase the number of shot regions for global alignment measurement, to improve the overlay accuracy.

Hence, focus measurement is executed for a region smaller than a shot region as a repeating unit, to calculate a process offset on the basis of the measurement result. Doing so allows focus mapping without decreasing the process offset calculation accuracy and throughput.

Figure 8:
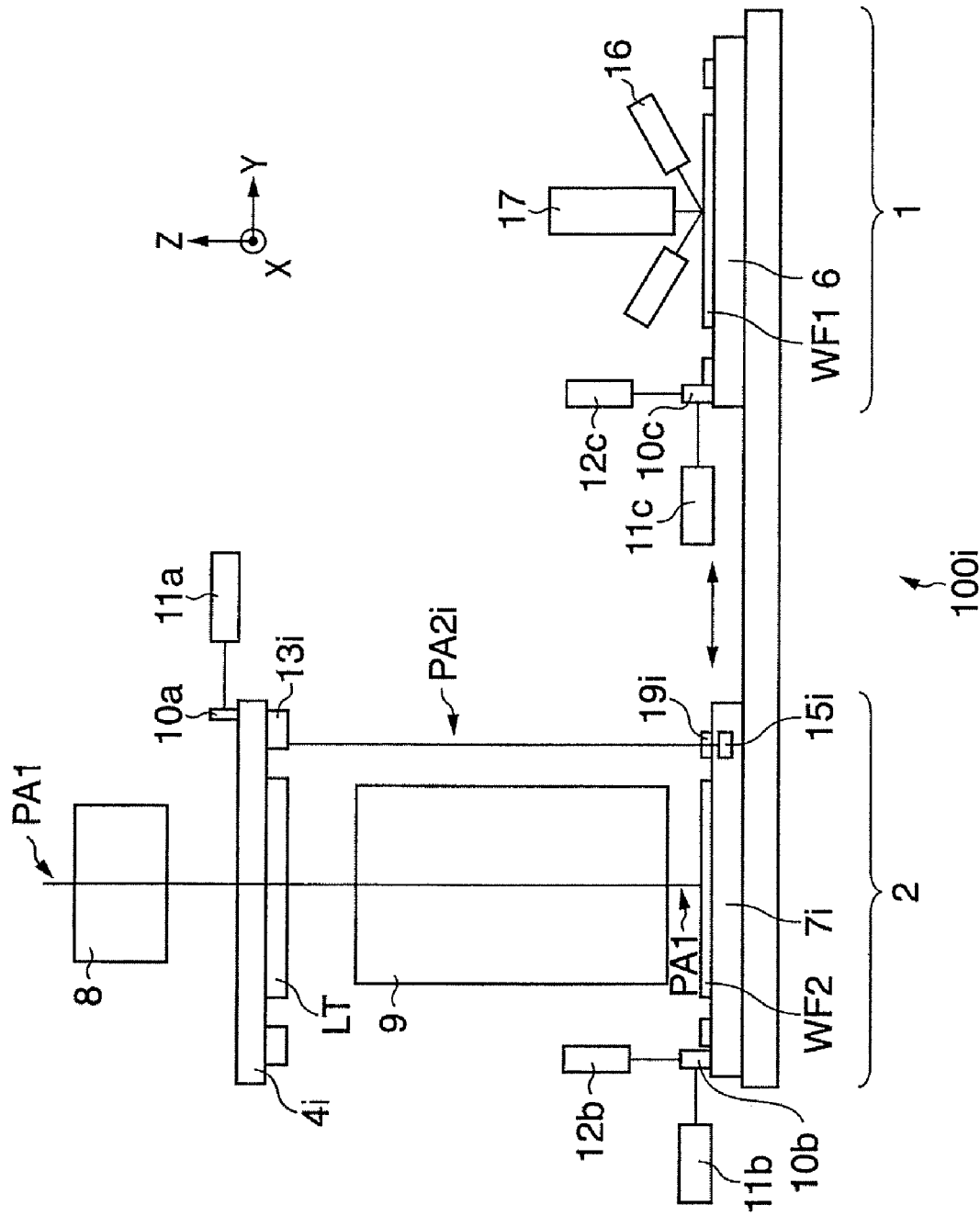
FIG. 8 is a view showing the arrangement of an exposure apparatus according to a modification to the first embodiment.

As shown in FIG. 8, an exposure apparatus 100$i$ may comprise a reticle stage 4$a$, a wafer stage 7$i$, and a reticle alignment detection system 15$i$, in place of the reticle stage 4, the wafer stage 7, and the reticle alignment detection system 15, respectively.

A reticle reference mark 13$i$ is formed on the reticle stage 4$i$. The reticle alignment detection system 15$i$ is located in the −Z direction with respect to the reticle reference mark 13$i$. The reticle alignment detection system 15$i$ uses measurement light having the same wavelength as the wavelength of exposure light to actually expose the wafer WF2. A reticle alignment detection system reference mark 19$i$ is formed on the stage reference plate 14 (see FIG. 4), of the wafer stage 7$i$ in the −Z direction, with respect to the reticle reference mark 13$i$. The reticle alignment detection system reference mark 19$i$ is a transmissive mark herein. Light applied from the reticle alignment detection system 15$i$ travels in the +Z direction along a second optical axis PA2$i$, and reaches the reticle reference mark 13$i$. The reflected light travels in the −Z direction along the second optical axis PA2$i$, and reaches the reticle alignment detection system 15$i$. Doing so makes it possible to detect a focal shift (a displacement in the Z direction from the focal plane) between the reticle reference mark 13$i$ and the reticle alignment detection system reference mark 19$i$, to allow the positioning between the reticle LT and the wafer WF2.

Figure 9:
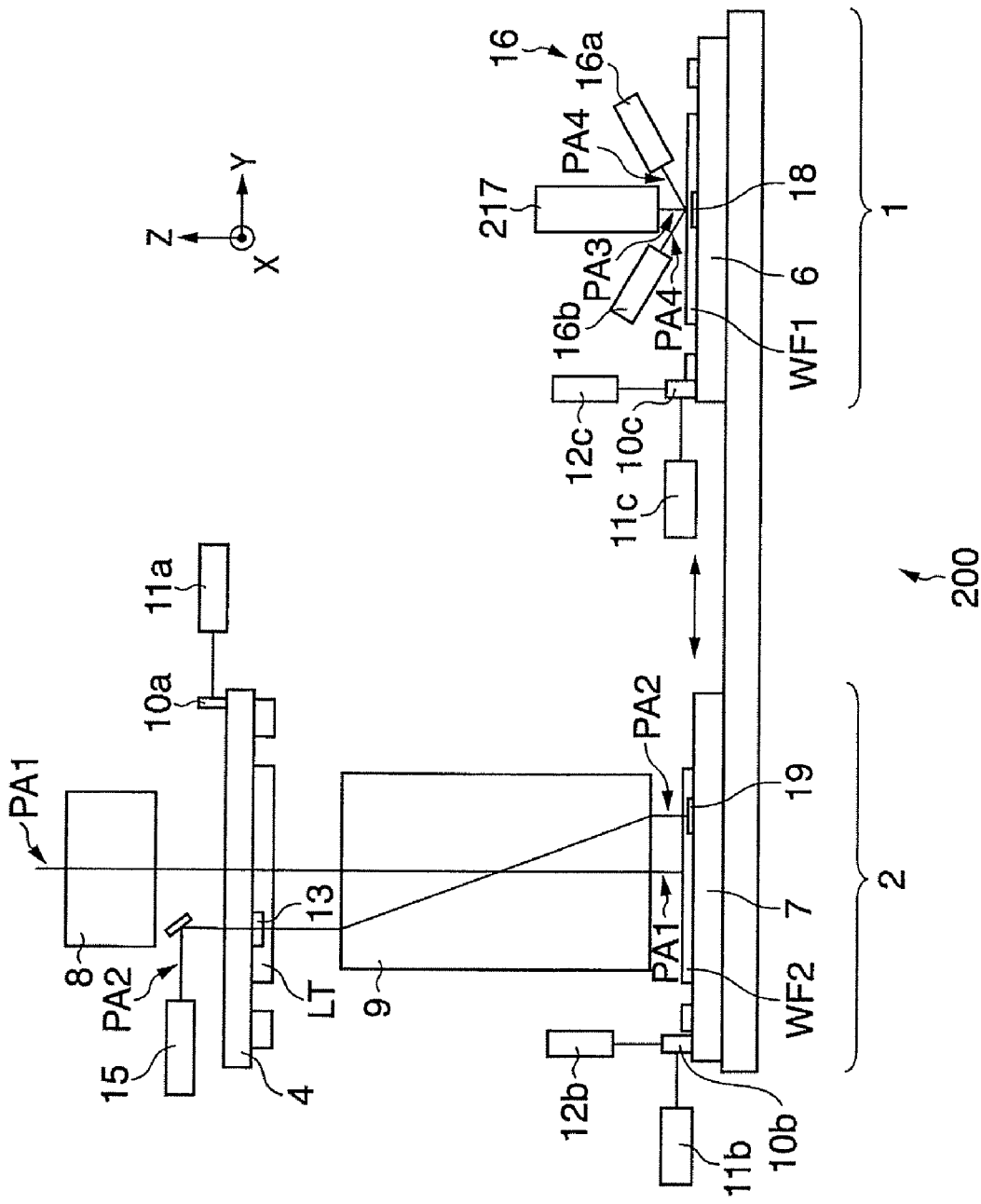
FIG. 9 is a view showing the arrangement of an exposure apparatus according to the second embodiment.

An exposure apparatus according to the second embodiment will be explained next, with reference to FIG. 9.

Although the basic arrangement of an exposure apparatus 200 is the same as that in the first embodiment, the second embodiment is different from the first embodiment in the control contents of a controller, and, in that, a wafer alignment detection system 217 substitutes for the wafer alignment detection system 17.

The controller controls operation to drive a wafer stage 6, such that the relative position between a target measurement region and a focus measurement region 53 in the X, Y, and Z directions, is constant, without wafer alignment measurement by the wafer alignment detection system 217 in advance. The target measurement region here means a region on the focal plane, where a slit image (e.g., the slit image SL shown in FIG. 6) is desirably formed, and which is constant relative to each of shot regions SAa to SAn along the X and Y directions. The focus measurement region 53 (see FIG. 12) means a region where a slit image (e.g., the slit image SL shown in FIG. 6) is actually formed.

Figure 12:
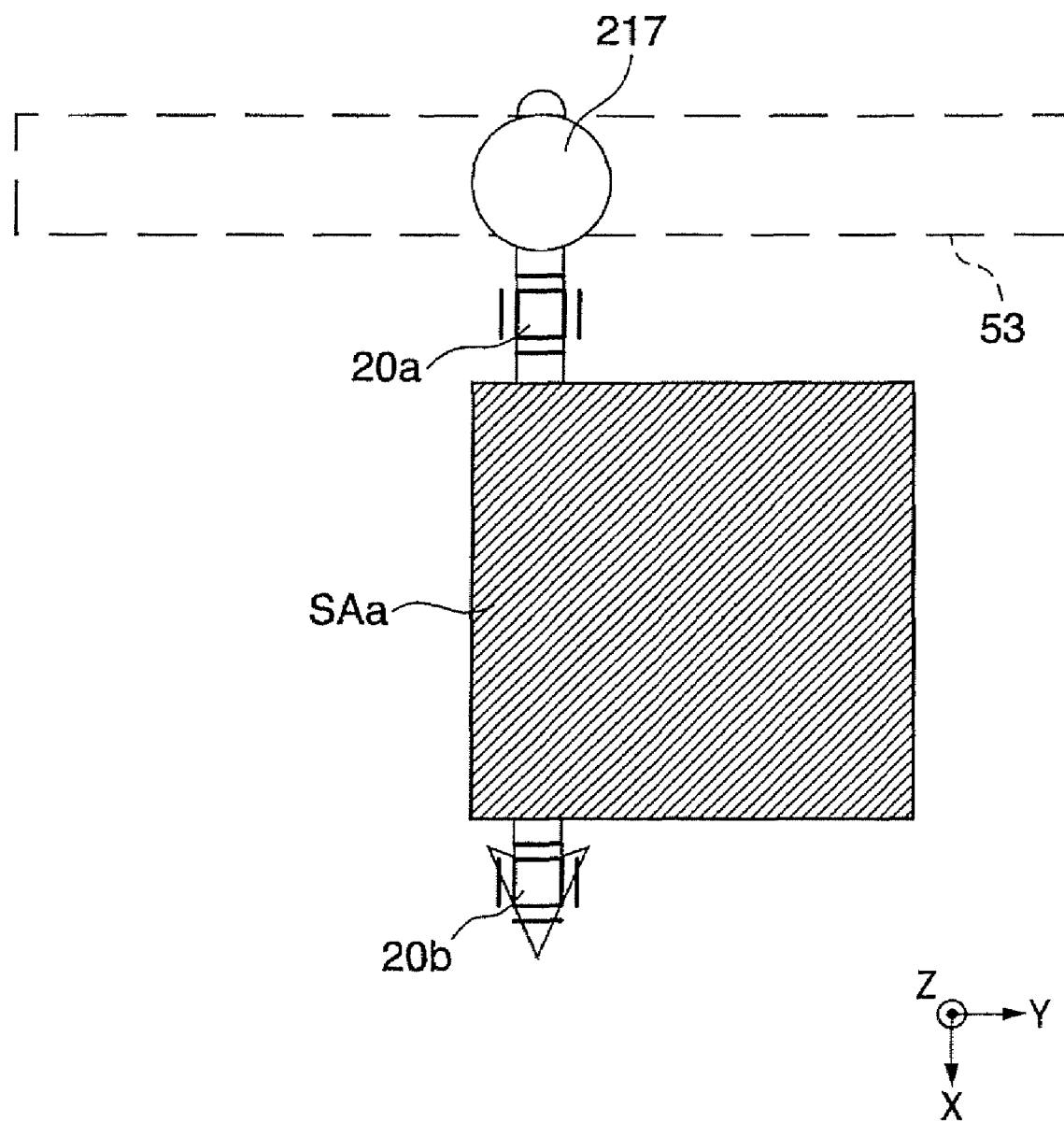
FIG. 12 is a view showing a focus measurement region and wafer alignment marks.

For example, as shown in FIG. 12, wafer alignment marks 20$a$ and 20$b$ are formed around the upper and lower sides of the shot region SAa. In focus mapping, the wafer alignment detection system 217 executes wafer alignment measurement (measures the wafer alignment mark 20$a$) immediately before focus measurement for the shot region SAa, and outputs the measurement result to the controller. The controller controls operation to drive the wafer stage 6 on the basis of this measurement result, such that the relative position between the focus measurement region 53 and the pattern of, e.g., an interconnection or an insulator in the shot region SAa in the X and Y directions is constant. That is, the plurality of shot regions SAa to SAn can undergo alignment measurement and focus measurement in parallel (almost simultaneously). This makes it possible to accurately measure a pattern offset (process offset), to improve the measurement throughput.

Figure 10:
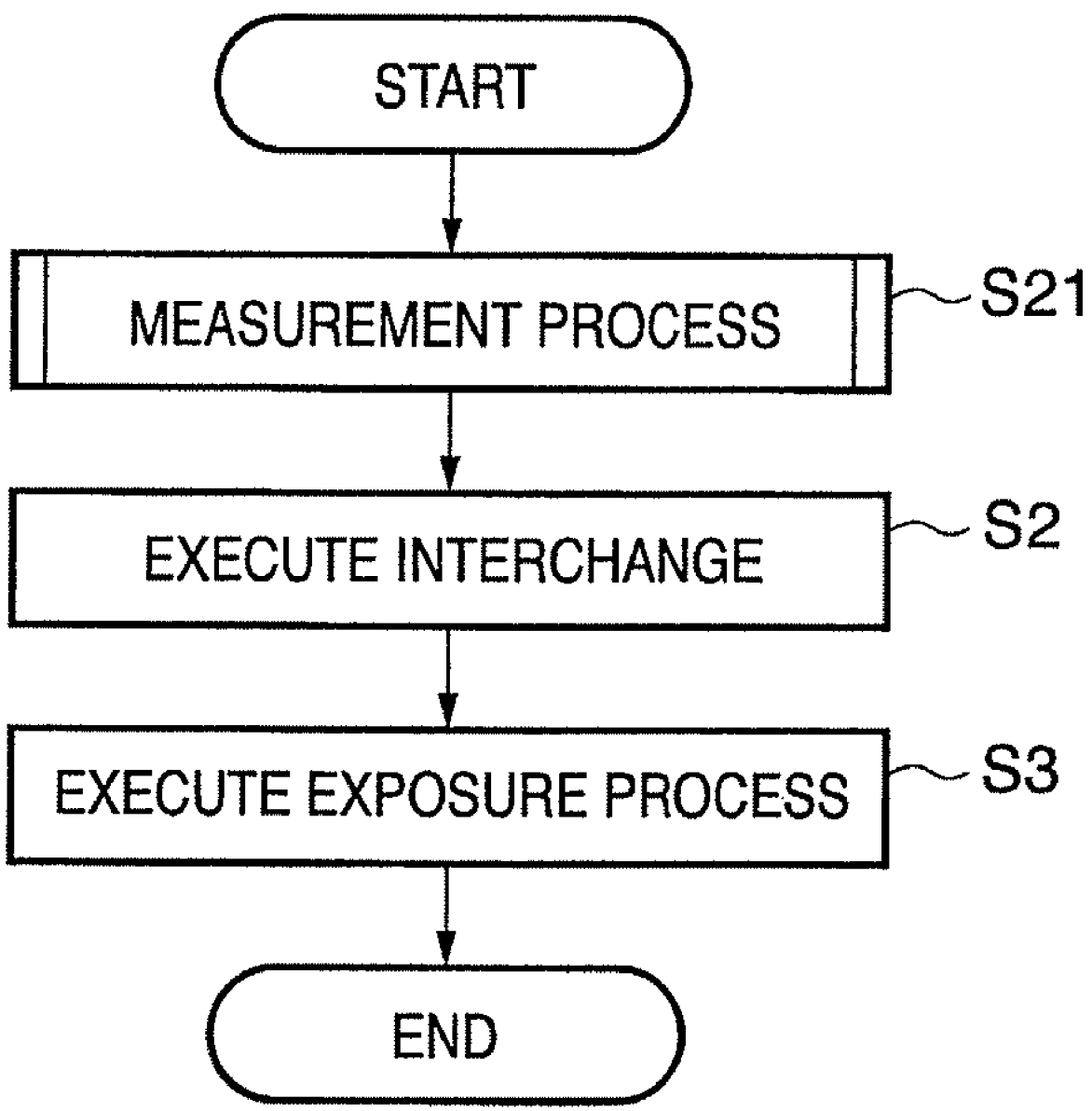
FIG. 10 is a flowchart illustrating a sequence of exposure steps performed by the exposure apparatus.

As shown in FIG. 10, a sequence of exposure steps performed by the exposure apparatus in the second embodiment is different from that in the first embodiment, in the following points.

Figure 11:
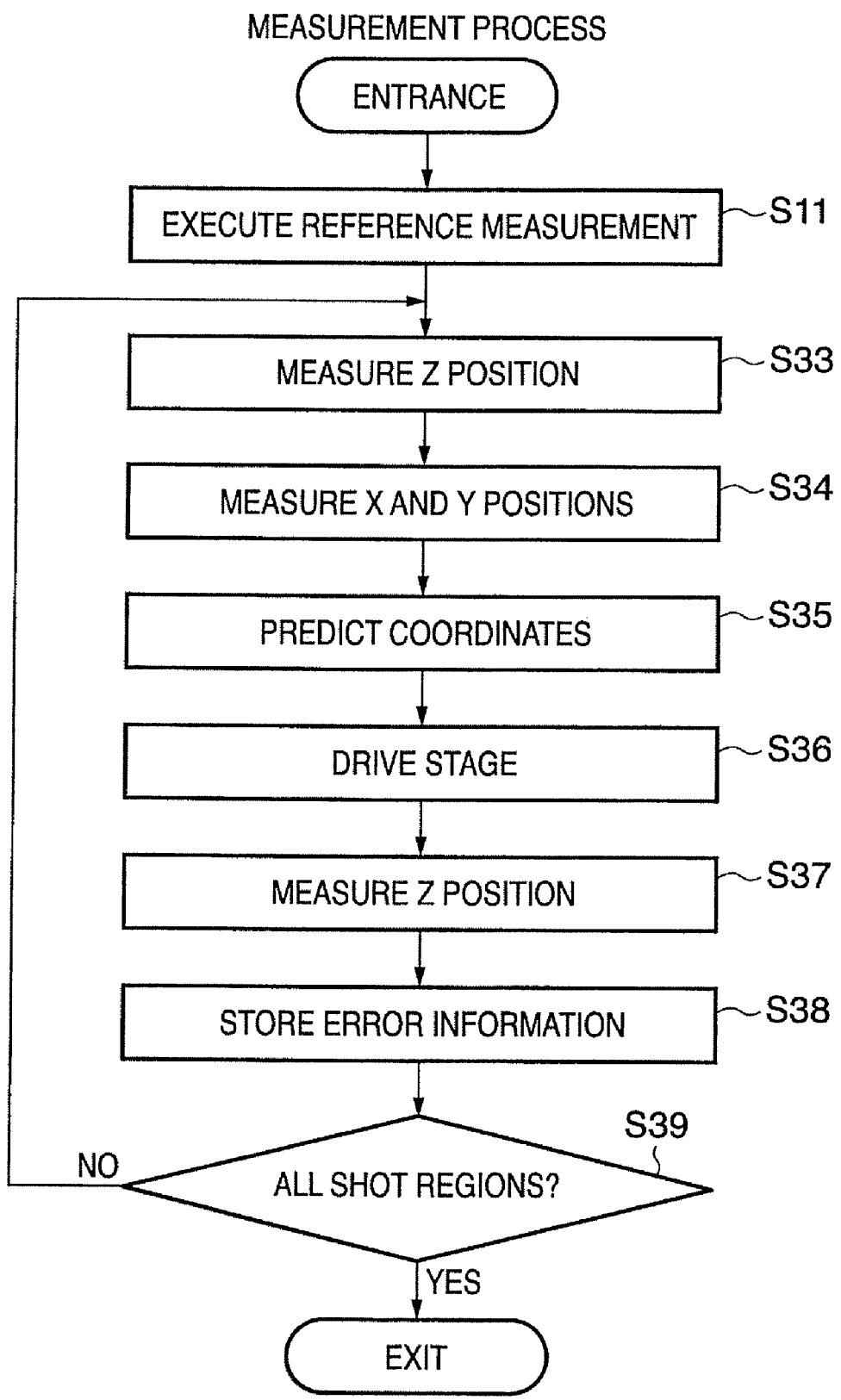
FIG. 11 is a flowchart illustrating a sequence of a measurement process.

In step S21, a measurement process different from that in step S1 (see FIG. 2) is executed. More specifically, as shown in FIG. 11, a measurement processing sequence in the second embodiment is different from that in the first embodiment, in the following points.

Figure 13:
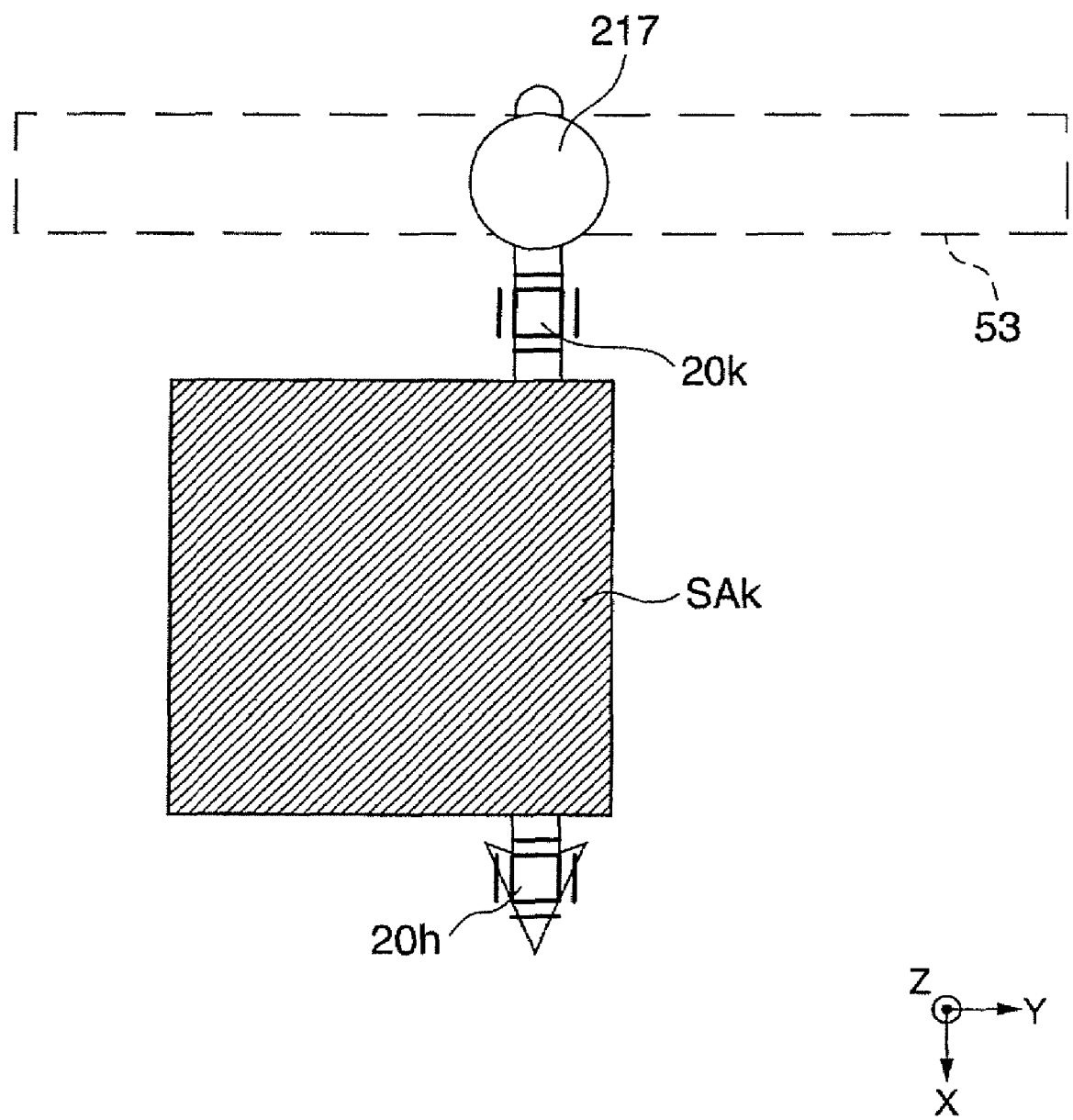
FIG. 13 is a view showing another focus measurement region and wafer alignment marks.

In step S33, a focus detection system 16 measures the position of one of wafer alignment marks 20a to 20n in the Z direction, and outputs the measurement result to the controller (see FIGS. 12 and 13). The controller stores the measurement result (the positions of the wafer alignment marks 20a to 20n in the Z direction).

In step S34, the wafer alignment detection system 217 measures the position of one of the wafer alignment marks 20a to 20n in the X and Y directions, and outputs the measurement result to the controller. The controller stores the measurement result (the positions of the wafer alignment marks 20a to 20n in the X and Y directions).

Meanwhile, during the interval between steps S33 and S34, the controller may determine whether a Z position is displaced from the focal plane by a predetermined value or more. If the controller determines that the Z position is displaced from the focal plane by the predetermined value or more, it controls operation to drive the wafer stage 6 in the Z direction to match the focal plane. Hence, the wafer alignment detection system 217 can execute measurement in step S34, while reducing the influence of the telecentricity of the optical system.

In step S35, on the basis of the measurement result obtained in step S34, the controller calculates the distance from a wafer alignment detection system reference mark 18 to one of the measured wafer alignment marks 20a to 20n. The controller statistically predicts the coordinates of one of the shot regions SAa to SAn, on the basis of this distance information.

This makes it possible to make the relative position between the focus measurement region 53 and the shot region SAa in the X, Y, and Z directions constant among all the shot regions in the wafer surface. It is also possible to accurately calculate a pattern offset (process offset) in focus mapping.

In step S36, the controller controls operation to drive the wafer stage 6, such that the position of a focus measurement region relative to a target measurement region is constant. The target measurement region here means a region on the focal plane, where a slit image (e.g., the slit image SL shown in FIG. 6) is desirably formed, and which is constant relative to each of the shot regions SAa to SAn along the X and Y directions. The focus measurement region 53 (see FIG. 12) means a region where a slit image (e.g., the slit image SL shown in FIG. 6) is actually formed.

That is, the controller moves a wafer WF1, such that the relative position of a focus measurement region relative to each of the plurality of shot regions SAa to SAn in the X and Y directions is constant. Alternatively, the controller moves the wafer WF1, such that the relative position of a focus measurement region relative to the focal plane in the Z direction is constant among the plurality of shot regions SAa to SAn.

For example, on the basis of the coordinates predicted in step S35 and the focus measurement value obtained in step S33, the controller controls operation to drive the wafer stage 6, such that the relative position of a focus measurement region relative to a shot region in the X and Y directions is constant.

In step S37, the focus detection system 16 measures the position of one of the wafer alignment marks 20a to 20n in the Z direction, and outputs the measurement result to the controller. The controller stores the measurement result (the positions of the wafer alignment marks 20a to 20n in the Z direction).

In step S38, upon receiving the pieces of position information of the wafer alignment marks 20a to 20n from the wafer alignment detection system 217 and focus detection system 16, the controller calculates a common component as a process offset. The controller determines the process offset as an error upon detecting a Z position. With the operation, the controller can specify information indicating the relationship between the position of the surface of the wafer WF1 in the X and Y directions and the error upon detecting the Z position, i.e., error information. The controller stores the error information.

In step S39, the controller determines whether all the selected shot regions SAa to SAn have been measured. If so, the process advances to step S33; otherwise, the process ends.

Meanwhile, the controller may predict the focus measurement value (Z position) of a target measurement shot region on the basis of those of its adjacent shot region and wafer alignment mark. The controller controls operation to drive the wafer stage 6 in the Z direction, to obtain the predicted focus measurement value (Z position). This makes it possible to reduce a focus measurement error.

The controller may also predict the focus measurement value of a shot region to be measured, using not only that of its adjacent shot region, but also, that of another shot region measured.

As shown in FIGS. 12 and 13, the dimension of the focus measurement region 53 in the Y direction may be about twice that of a shot region. In this case, the center point measured by the wafer alignment detection system 217 may match the center of the focus measurement region 53. This facilitates a shift from a focus measurement for the focus measurement regions 53 in a shot region SAa (to SAk to SAn) to alignment measurement for a wafer alignment mark 20a (to 20k and 20h to 20n). That is, it is possible to reduce the stage driving amount in the Y direction to improve the throughput of the measurement process. This makes it possible to reduce an error upon controlling the wafer stage.

Figure 14:
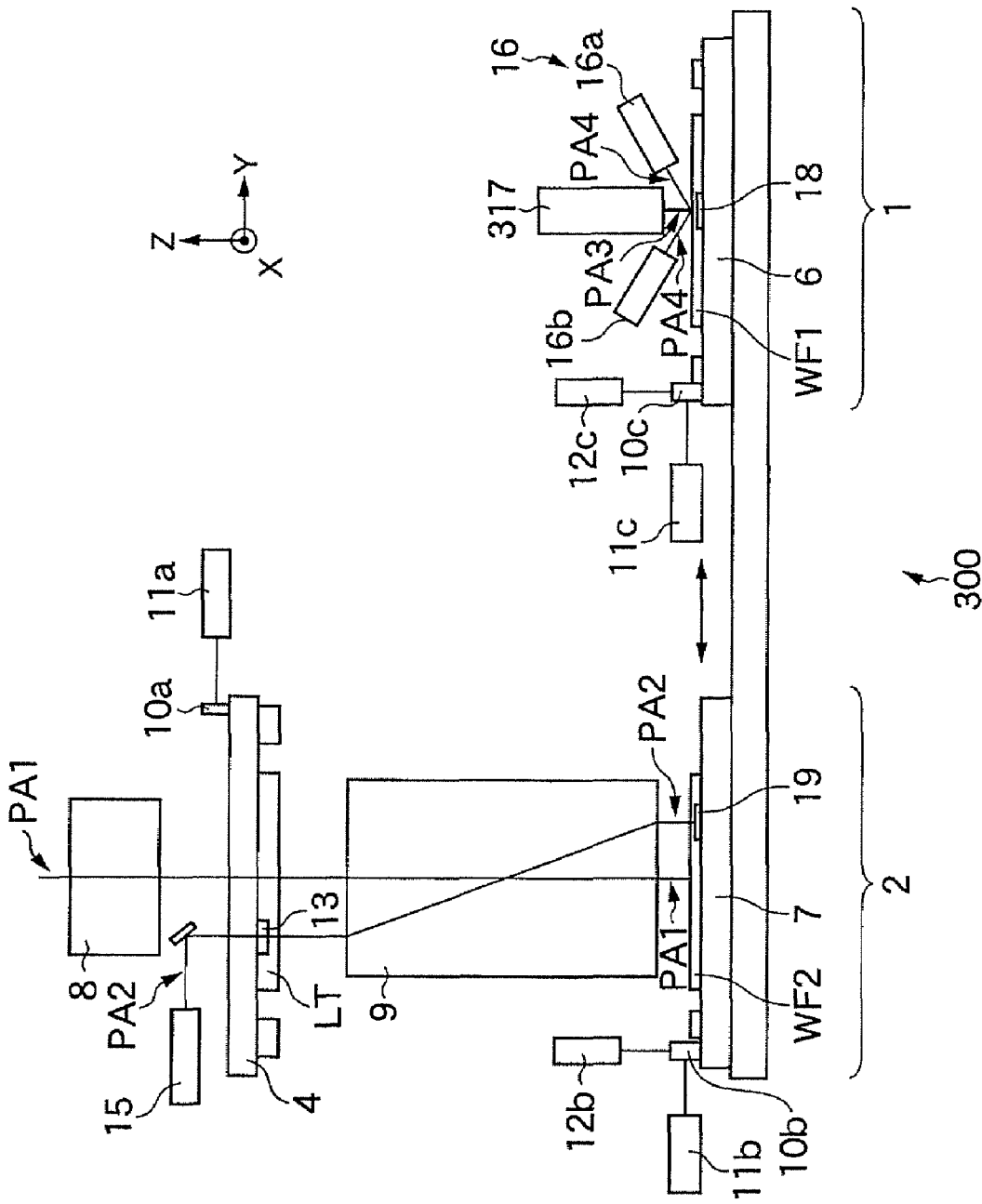
FIG. 14 is a view showing the arrangement of an exposure apparatus according to the third embodiment.

An exposure apparatus according to the third embodiment will be explained next, with reference to FIG. 14.

Although the basic arrangement of an exposure apparatus 300 is the same as that in the first embodiment, the third embodiment is different from the first embodiment in the control contents of a controller, and, in that, a wafer alignment detection system 317 substitutes for the wafer alignment detection system 17.

Figure 15:
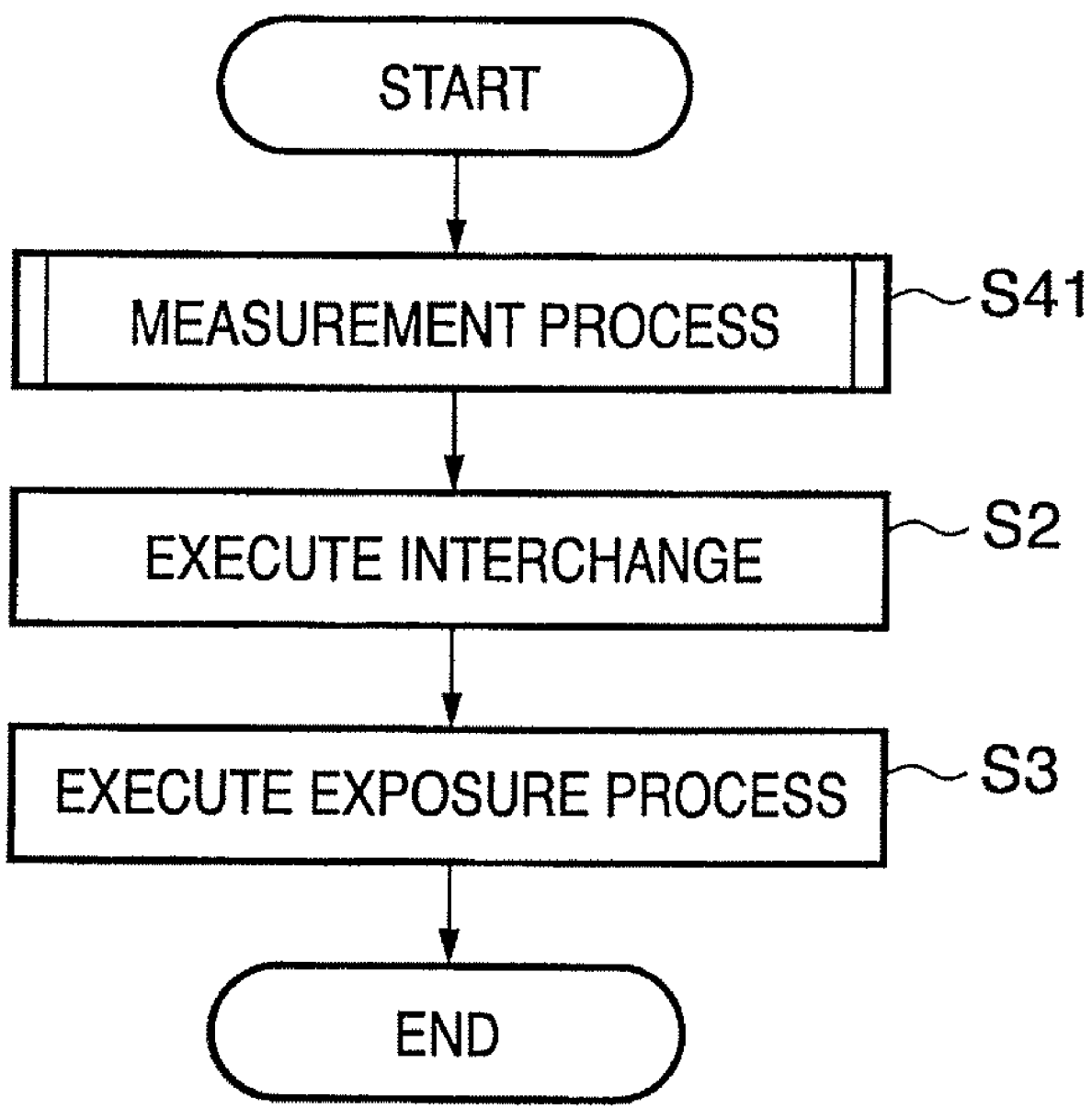
FIG. 15 is a flowchart illustrating a sequence of exposure steps performed by the exposure apparatus.

As shown in FIG. 15, a sequence of exposure steps by the exposure apparatus in the third embodiment is different from that in the first embodiment, in the following points.

Figure 16:
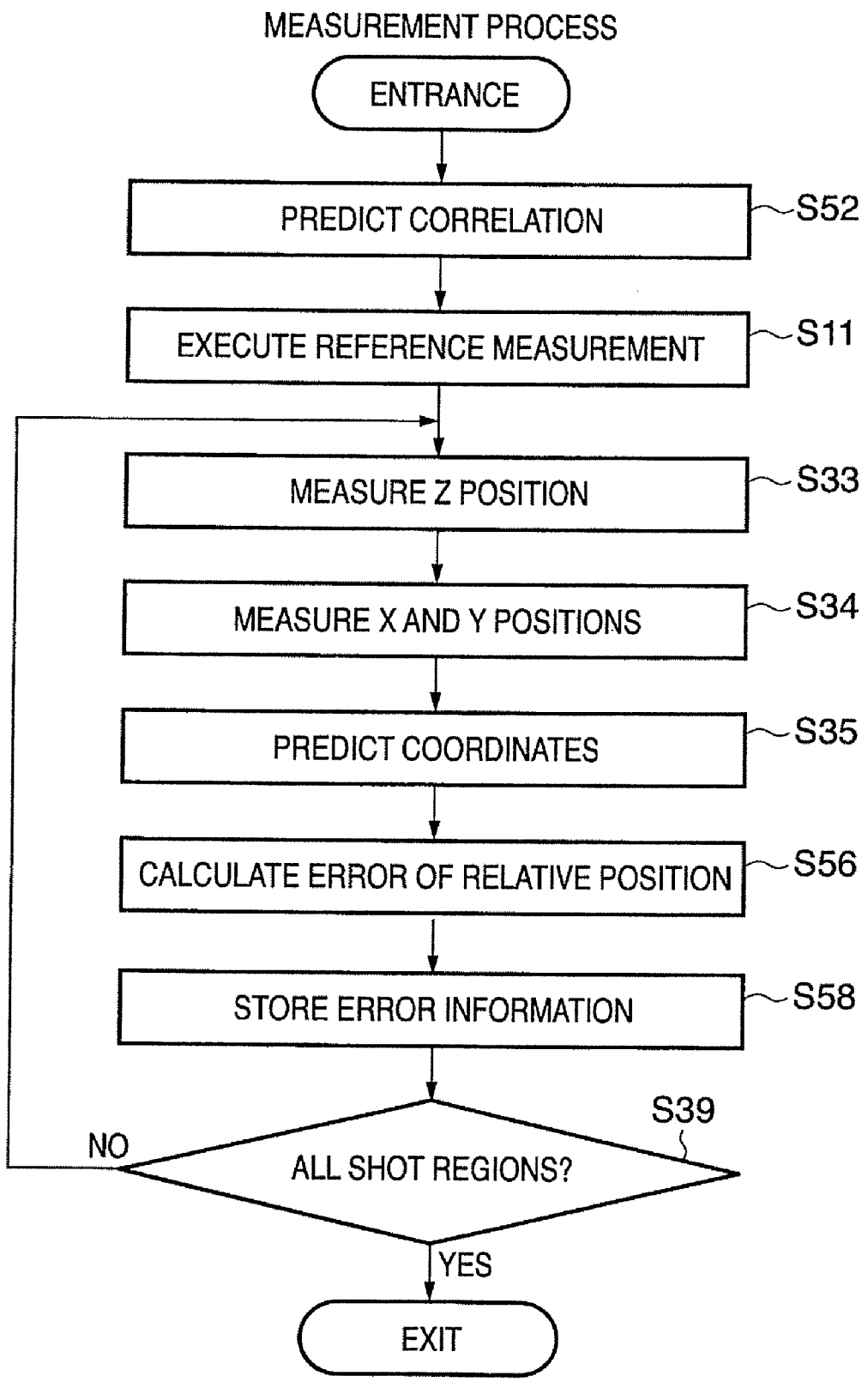
FIG. 16 is a flowchart illustrating a sequence of a measurement process.

In step S41, a measurement process different from that in step S1 (see FIG. 2) is executed. More specifically, as shown in FIG. 16, a measurement processing sequence in the third embodiment is different from that in the first embodiment, in the following points.

In step S52 (storage step), the wafer alignment detection system 317 measures the position, in the X and Y directions, of an arbitrary shot region in a wafer and that of a focus measurement region, and outputs the measurement result to the controller. A focus detection system 16 executes focus measurement and outputs the measurement result to the controller. The controller selects a certain shot region (e.g., a shot region SAa) as a reference shot region.

On the basis of the measurement result obtained by the wafer alignment detection system 317 and the measurement result obtained by measuring the vicinity of a wafer alignment detection mark using the focus detection system 16, the controller stores the correlation between a Z position upon alignment measurement and the measurement result obtained by the wafer alignment detection system 317. The controller executes driving in the Z direction by a given amount, and then, stores the Z position upon alignment measurement and the measurement result obtained by the wafer alignment detection system 317. This makes it possible to calculate a measurement error in the X and Y directions with respect to a displacement detected by the wafer alignment detection system 317 in the Z direction.

Assume that the wafer alignment detection system 317 is in focus with an alignment mark (a measurement error in the X and Y directions is small). The controller calculates the relative position of a focus measurement region relative to the shot region SAa in the X and Y directions, on the basis of the measurement result obtained by the wafer alignment detection system 317.

The controller stores the resultant relative position in the X and Y directions together with the measurement result obtained by the focus detection system 16. The controller executes driving such that the relative position of the focus measurement region relative to the shot region SAa in the X and Y directions is displaced in the X or Y direction by a given amount. The controller then stores the measurement result obtained by the focus detection system 16 with respect to this relative position in the X and Y directions. In this manner, the controller stores the correlation (correlation information) between the focus measurement value and the relative position of the focus measurement region relative to the shot region SAa in the X and Y directions. Likewise, the controller stores the correlation (correlation information) between the focus measurement value and the relative position of a focus measurement region relative to each of shot regions SAb, . . . (see FIG. 4) in the X and Y directions. At this time, the controller may individually store the correlations (pieces of correlation information) for respective shot regions, or may store, as a representative correlation (correlation information), results of the averaging or function approximation between shot regions.

This correlation information indicates the correlation between the relative position of a focus measurement region relative to a shot region in the X and Y directions and a focus measurement error.

Meanwhile, the controller may store the correlation information at an arbitrary timing before focus mapping (step S33). The correlation information largely depends on the pattern structure of, e.g., an interconnection or an insulator in a shot region. For this reason, it suffices to measure at least one shot region or a plurality of shot regions having the same or similar pattern structure of, e.g., the interconnection or an insulator. However, the optical characteristics of the pattern of, e.g., the interconnection or an insulator often vary due to the following reason. That is, the reflectance of the pattern of, e.g., the interconnection or an insulator may change among shot regions, or pattern layers of, e.g., the interconnection or an insulator may have different thicknesses. In this case, the controller stores the average value (a relative position of a focus measurement region in the X and Y directions, and a focus measurement error) of several shot regions in a wafer. This makes it possible to average this variation to accurately calculate the correlation information.

In step S56 (calculation step), on the basis of the measurement result (the position information in the Z direction) obtained in step S33, the controller calculates a displacement (defocus), in the Z direction, of a region measured by the wafer alignment detection system 317. The controller calculates a displacement of the relative position between a focus measurement region and a target measurement region in the X and Y directions on the basis of the displacement, in the Z direction, of the region measured by the wafer alignment detection system 317 and the measurement result (the position information in the X and Y directions) obtained in step S34.

In step S58 (correction step), the controller corrects the focus measurement value measured in step S33, on the basis of the displacement of the relative position calculated in step S56 and the correlation information stored in step S52. The corrected focus measurement value is defined as a detection value at a Z position. On the other hand, the controller stores an alignment measurement value at X and Y positions.

As in the case wherein the relative position of a focus measurement region relative to a shot region in the X and Y directions is constant among all the shot regions in the wafer surface, it is possible to accurately calculate a pattern offset (process offset) in focus mapping.

Assume that wafer alignment marks are laid out at two, i.e., upper and lower portions of a shot region or at its left and right portions. Even in this case, it is possible to improve the accuracy of measuring a pattern offset (process offset) to improve the measurement throughput.

Meanwhile, step S58 in FIG. 16 may follow step S39.

Figure 17:
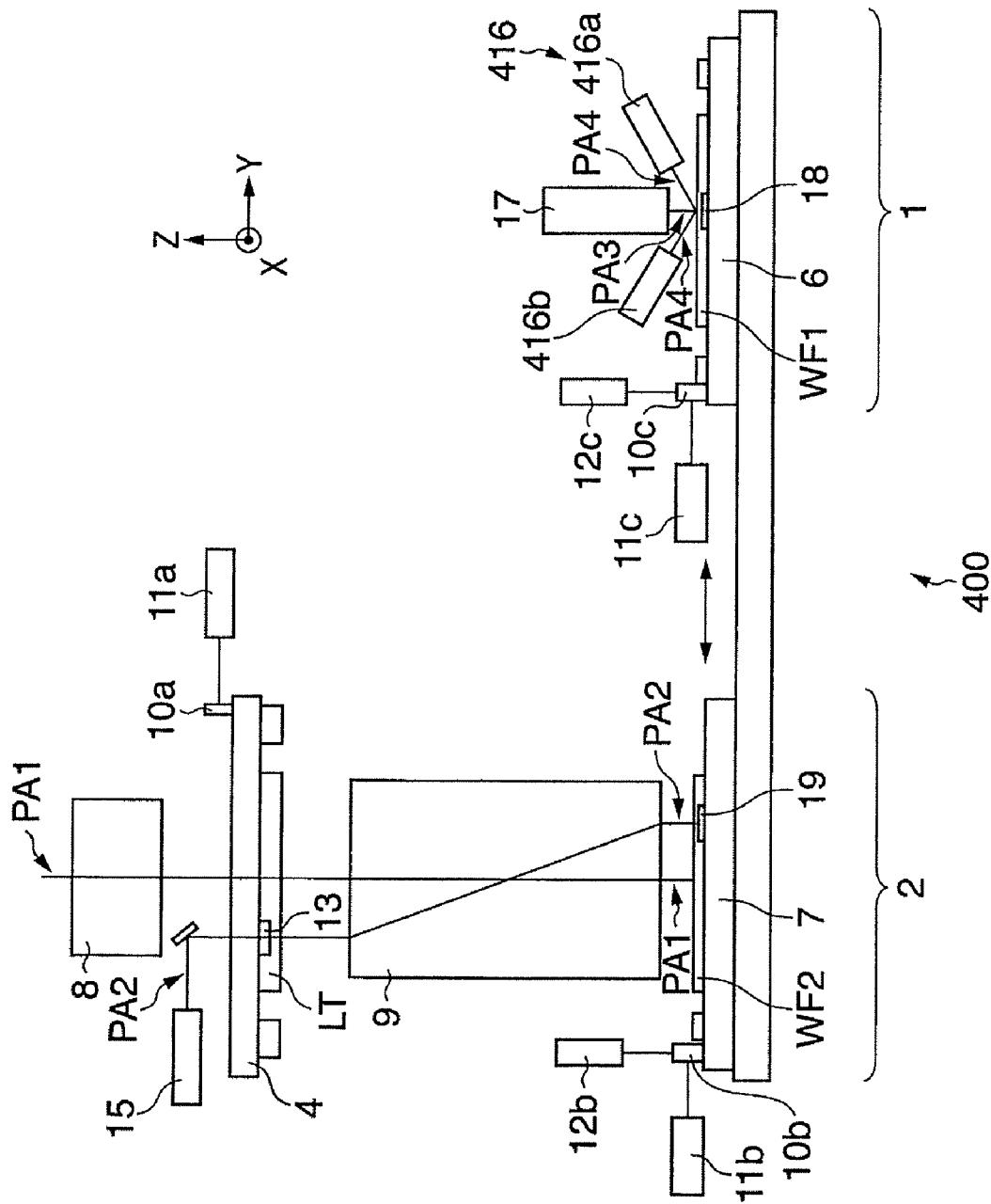
FIG. 17 is a view showing the arrangement of an exposure apparatus according to the fourth embodiment.

An exposure apparatus according to the fourth embodiment will be explained next, with reference to FIG. 17.

Although the basic arrangement of an exposure apparatus 400 is the same as that in the first embodiment, the fourth embodiment is different from the first embodiment in the control contents of a controller, and in that a focus detection system 416 substitutes for the focus detection system 16. The focus detection system 416 includes a light-projecting system 416*a* and a light-receiving system 416*b*. The focus detection system 416 also includes a pre-detection measurement region (second measurement region) 453 juxtaposed in the wafer scanning direction (see FIG. 20).

Figure 18:
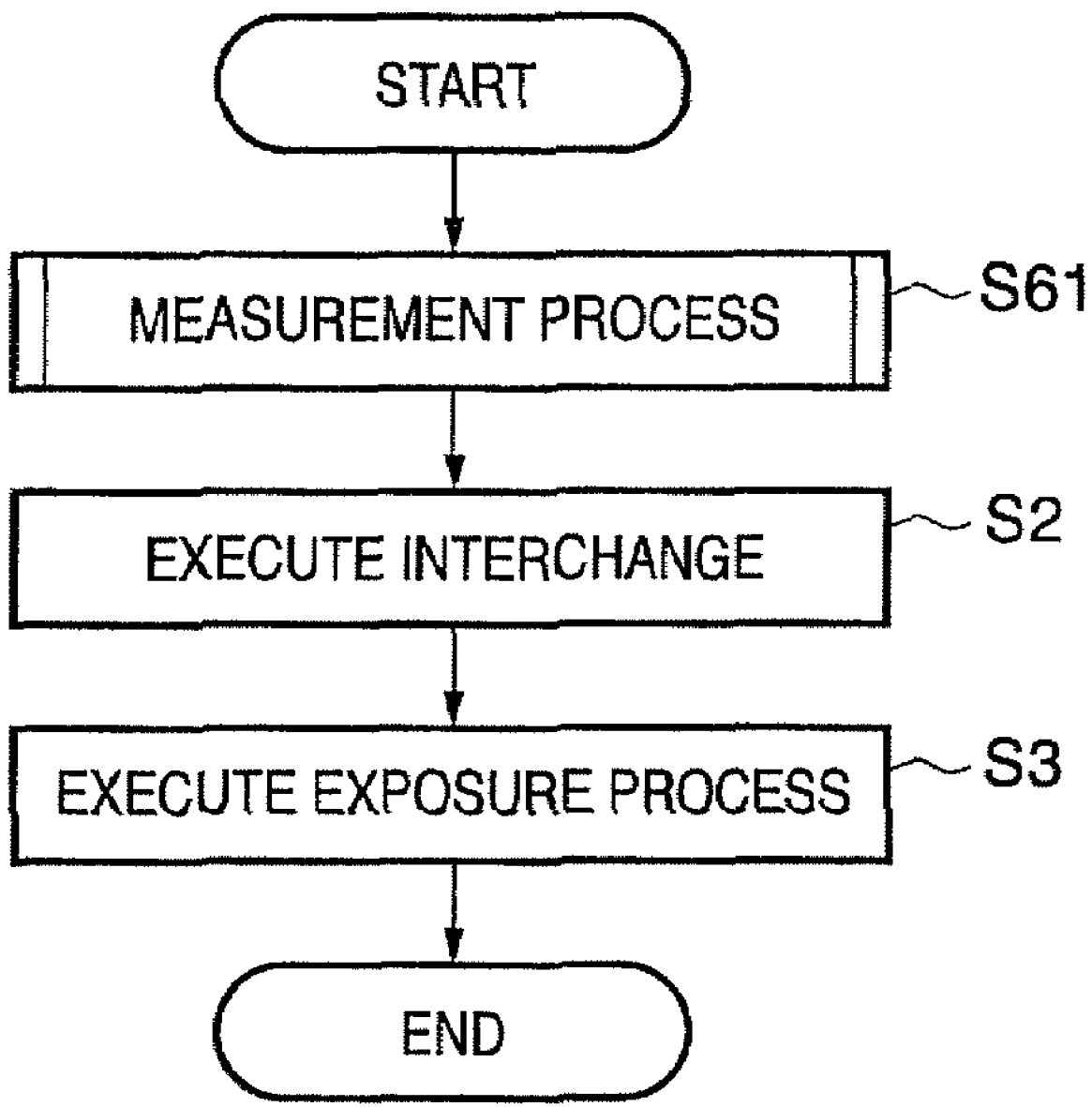
FIG. 18 is a flowchart illustrating a sequence of exposure steps performed by the exposure apparatus.

As shown in FIG. 18, a sequence of exposure steps performed by the exposure apparatus in the fourth embodiment is different from that in the first embodiment, in the following points.

Figure 19:
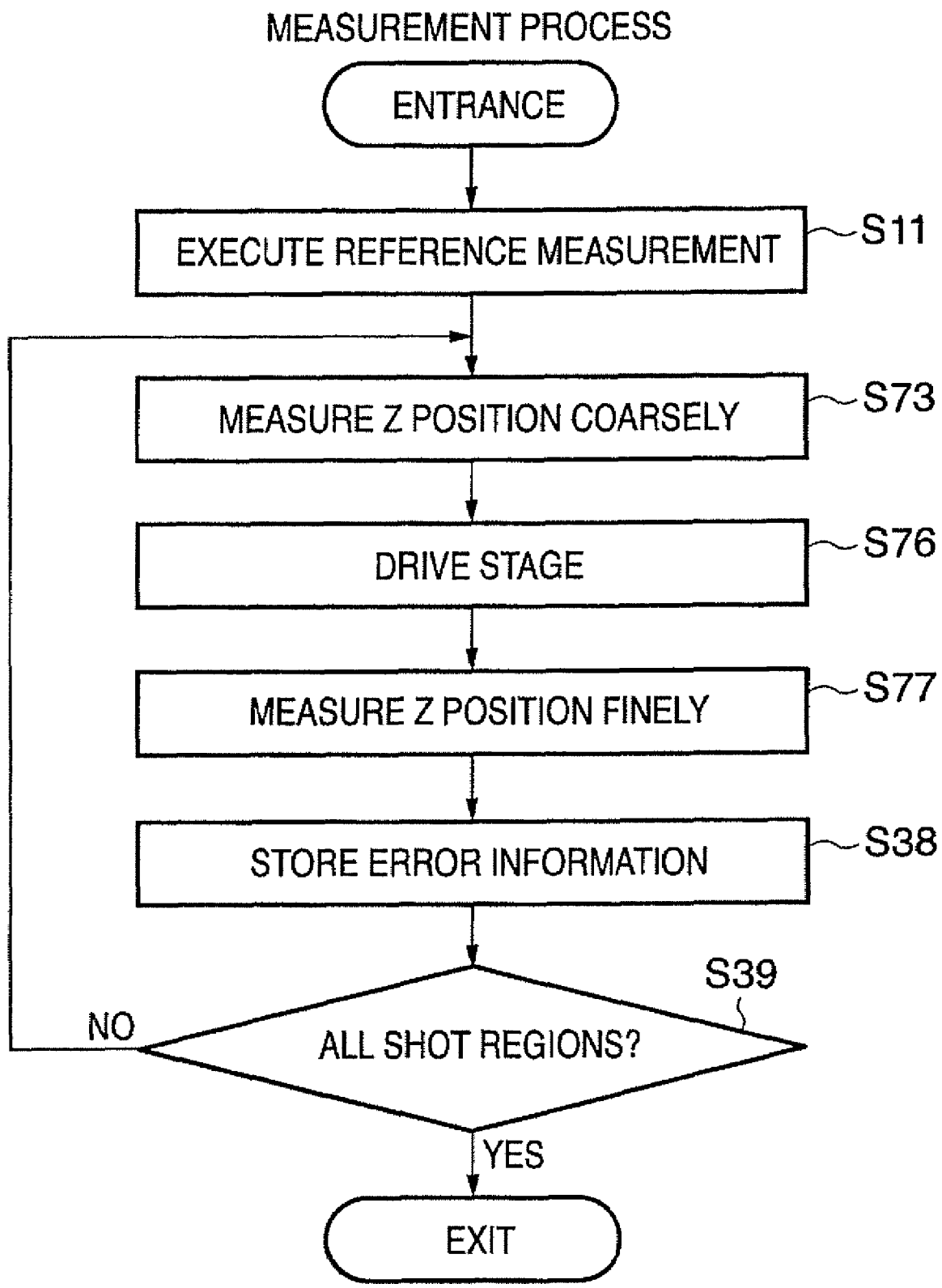
FIG. 19 is a flowchart illustrating a sequence of a measurement process.

In step S61, a measurement process different from that in step S1 (see FIG. 2) is executed. More specifically, as shown in FIG. 19, a sequence of measurement processes in the fourth embodiment is different from that in the first embodiment, in the following points.

Figure 20:
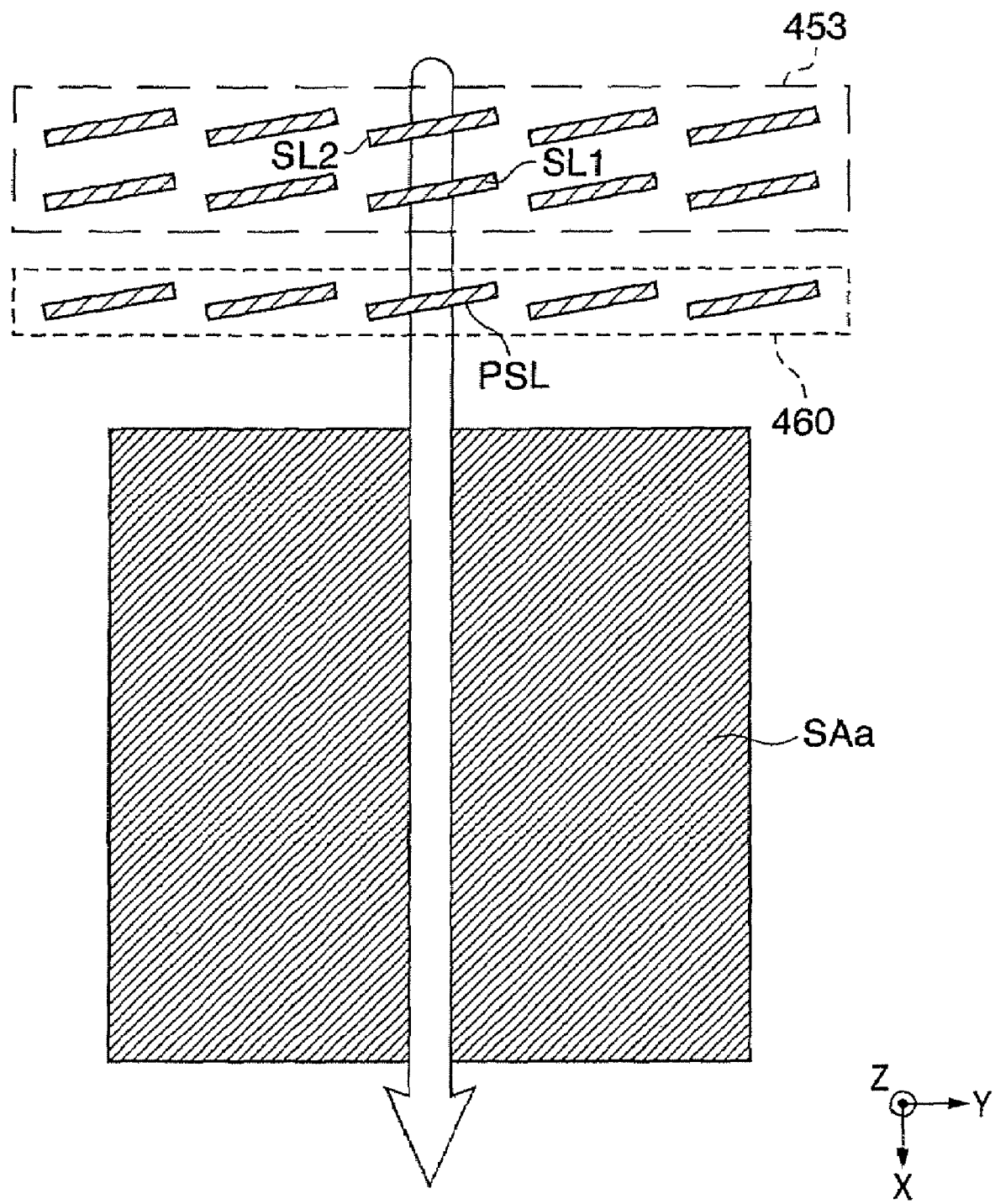
FIG. 20 is a view showing a focus measurement region and a pre-detection measurement region.

In step S73 (fourth level measurement step), the focus detection system 416 measures (with the first accuracy) a Z position at a measurement point arranged in the measurement region 460 where it reaches a shot region SAa prior to the focus measurement region 453 (see FIG. 20). An example of this measurement point is a position at which a pre-detection slit image PSL is formed. The focus detection system 416 outputs the measurement result (the Z position at which the pre-detection slit image PSL is formed) to the controller. The controller stores the measurement result together with the X and Y coordinates of the measured region (pre-detection measurement region 460).

In step S76, using the focus measurement value obtained in step S73, the controller controls operation to drive the wafer stage 6, such that the relative position of the focus measurement region 453 relative to a target measurement region is constant. The target measurement region here means a region where a slit image (e.g., a slit image SL1 or SL2 shown in FIG. 20) is desirably formed, and which has a constant relative position to each of shot regions SAa to SAn along the X, Y, and Z directions. The focus measurement region 453 (see FIG. 20) means a region where a slit image (e.g., the slit image SL1 or SL2 shown in FIG. 20) is actually formed.

That is, the controller moves the wafer WF1, such that the relative position of the focus measurement region 453 relative to each of the plurality of shot regions SAa to SAn in the Z direction is constant.

In step S77 (fifth level measurement step), the following process is executed. The focus detection system 416 measures, with the second accuracy, a Z position at a plurality of measurement points (e.g., the slit images SL1 and SL2) arranged on the focus measurement region 453 (see FIG. 20), and outputs the measurement result to the controller. The controller stores the measurement result. The second accuracy is higher than the first accuracy.

Meanwhile, FIG. 20 exemplifies a case wherein three slit images (the pre-detection slit image PSL and slit images SL1 and SL2) are arranged in a direction (a direction opposite to a direction in which the wafer stage 6 moves relative to the focus detection system 416), in which the focus measurement region travels. Alternatively, one or more pre-detection slit images and one or more slit images (on the focus measurement region) may be arranged in the direction in which the focus measurement region travels.

During the wafer mapping for focus measurement over the entire wafer surface, the direction in which the focus measurement region travels may be switched to the Y direction. Marks in the front row with respect to the direction in which the focus measurement region travels are set as pre-detection marks. The measurement direction in this case may be the +Y direction or −Y direction.

Figure 21:
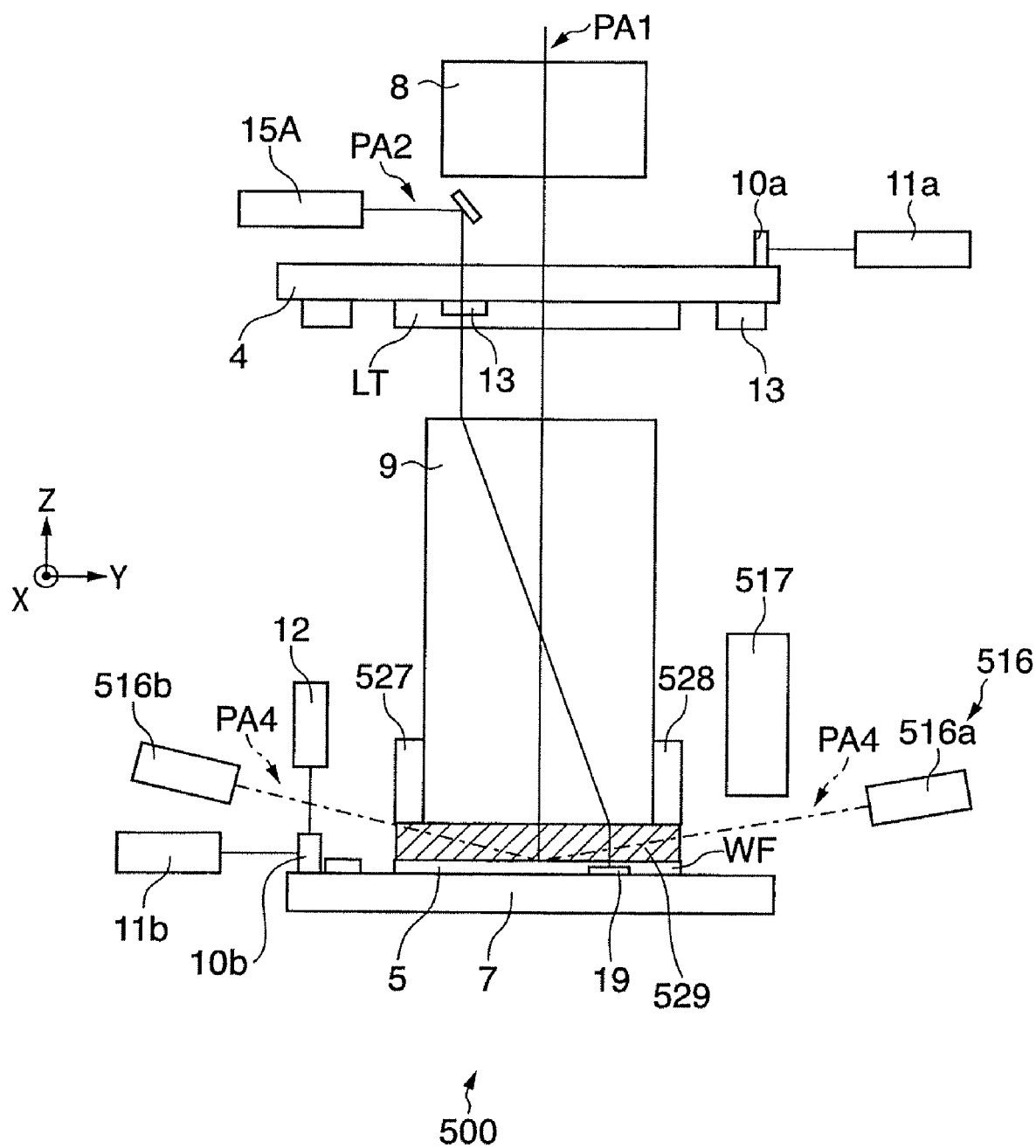
FIG. 21 is a view showing the arrangement of an exposure apparatus according to the fifth embodiment.

An exposure apparatus according to the fifth embodiment will be explained next, with reference to FIG. 21.

Although the basic arrangement of an exposure apparatus 500 is the same as that in the first embodiment, the fifth embodiment is different from the first embodiment in that exposure apparatus 500 is a single-stage type immersion exposure apparatus.

In the exposure apparatus 500, at least a partial space between a projection optical system 9 and a wafer WF is filled with a liquid 529 having a refractive index higher than one. For example, in the exposure apparatus 500, the space between the wafer WF and the projection optical system 9 is filled with a liquid 529 having a refractive index close to that of a photoresist layer (>1). This makes it possible to increase the effective numerical aperture of the projection optical system 9 when viewed from the wafer WF, to improve the resolving power.

As the space between the wafer WF and the projection optical system 9 is filled with the liquid 529 having a refractive index close to that of the photoresist layer before an exposure process in the exposure apparatus 500, a focus detection system 516 can hardly measure the surface level of the wafer WF (the surface level of the photoresist). In other words, since the exposure apparatus 500 cannot simultaneously execute an exposure process and a measurement process (especially, focus measurement), for a shot region, the measurement process, including focus measurement in step S1 (see FIG. 22), must be executed before an exposure process, in advance. The liquid 529 to fill the space between the wafer WF and the projection optical system 9 is supplied by a liquid supply unit 527 before an exposure process, and recovered by a liquid recovery unit 528 after the exposure process. The focus detection system 516 includes a light-projecting system 516a and a light-receiving system 516b.

Figure 22:
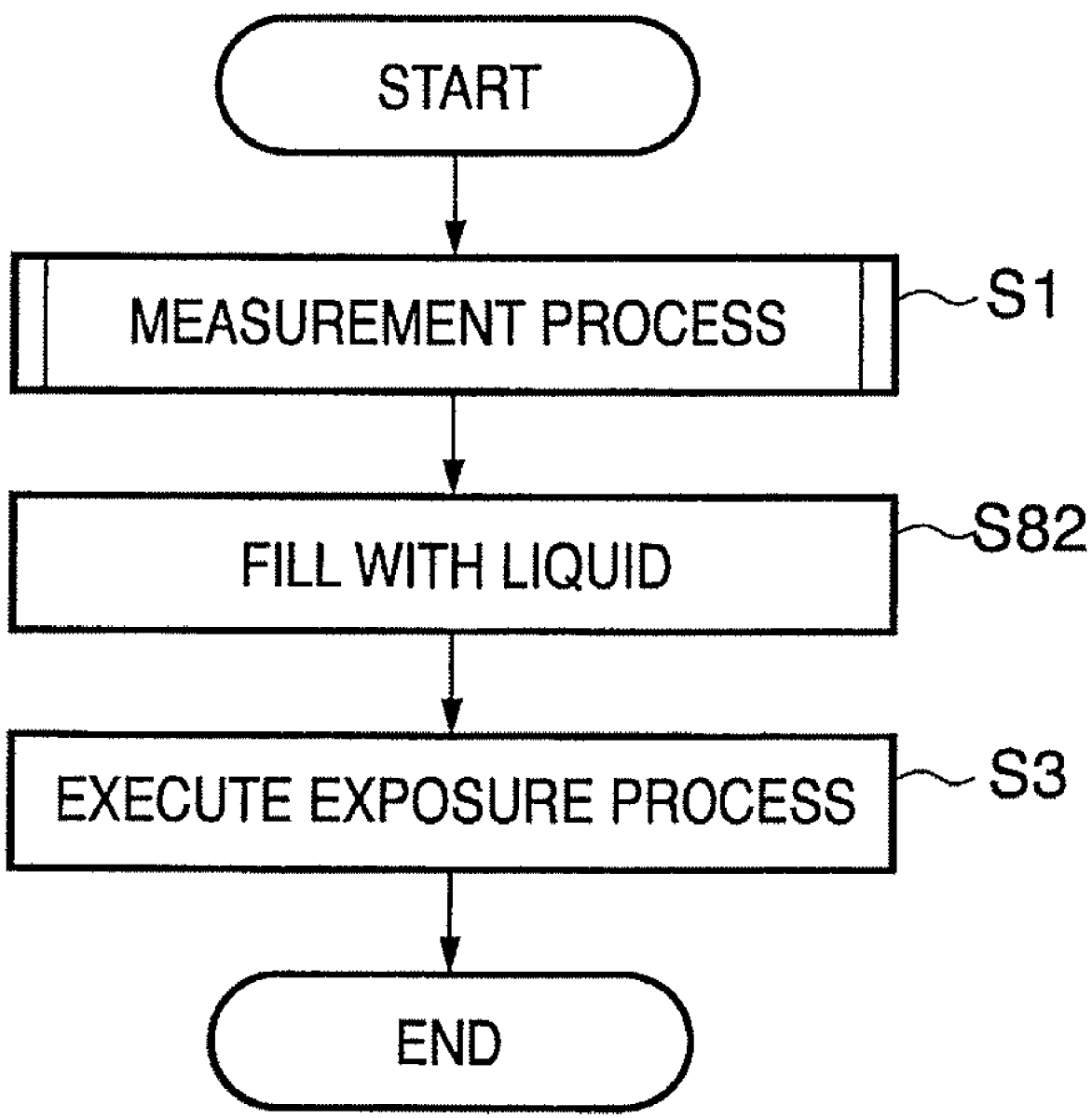
FIG. 22 is a flowchart illustrating a sequence of exposure steps performed by the exposure apparatus.

As shown in FIG. 22, a sequence of exposure steps performed by the exposure apparatus in the fifth embodiment is different from that in the first embodiment, in the following points.

In step S82, the space between the wafer WF and the projection optical system 9 is filled with the liquid 529 having a refractive index close to that of the photoresist layer.

Figure 23:
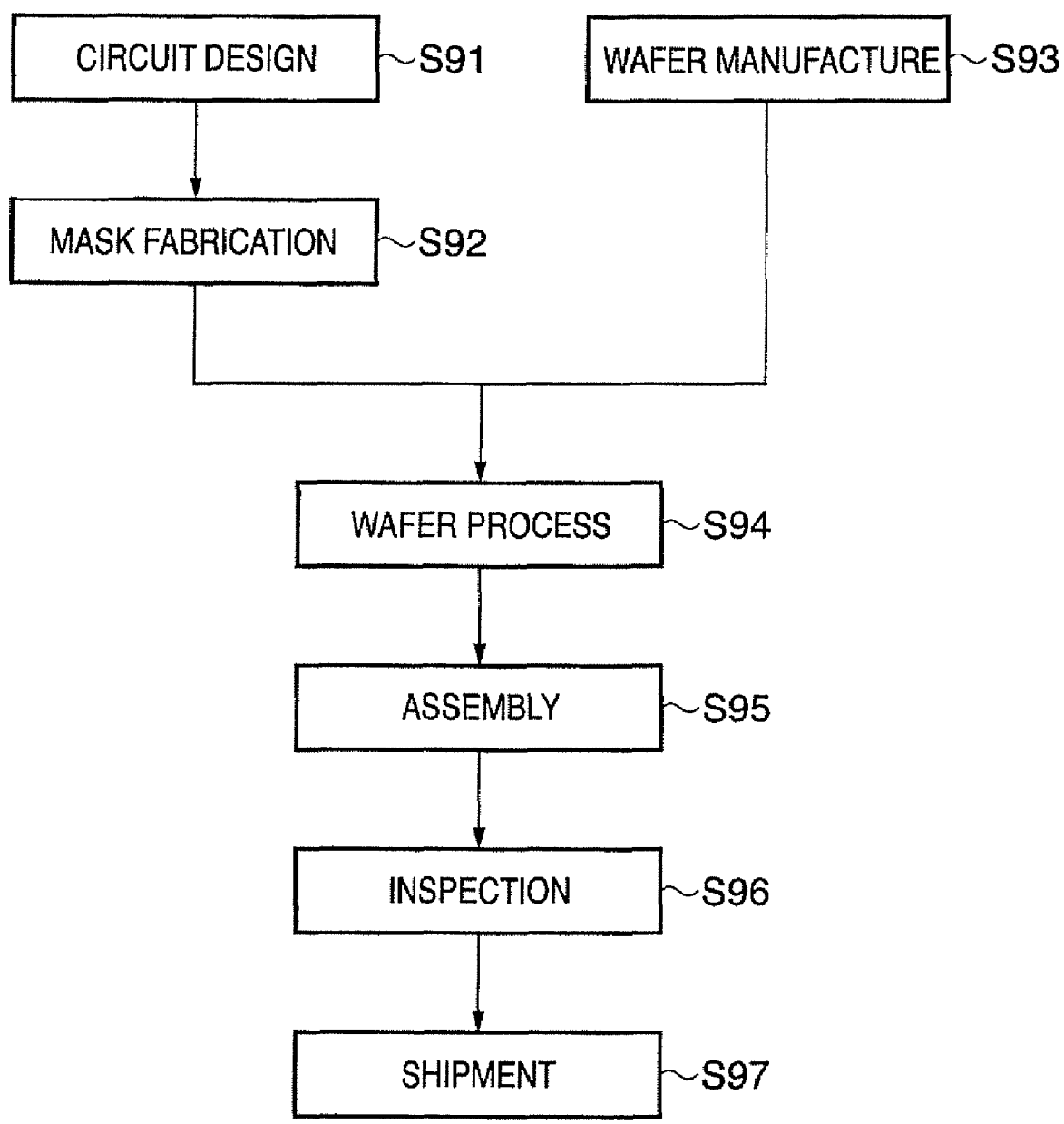
FIG. 23 is a flowchart illustrating a sequence of an overall semiconductor device manufacturing process.
Figure 24:
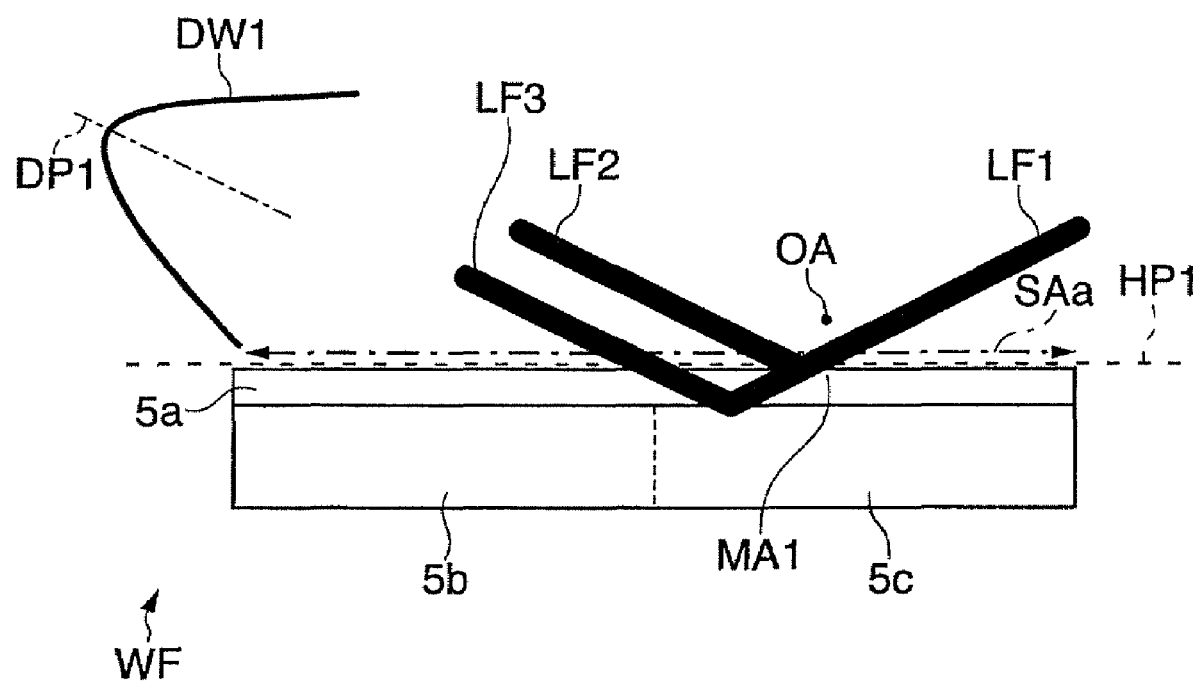
FIG. 24 is a view showing a problem to be solved by the present invention.
Figure 25:
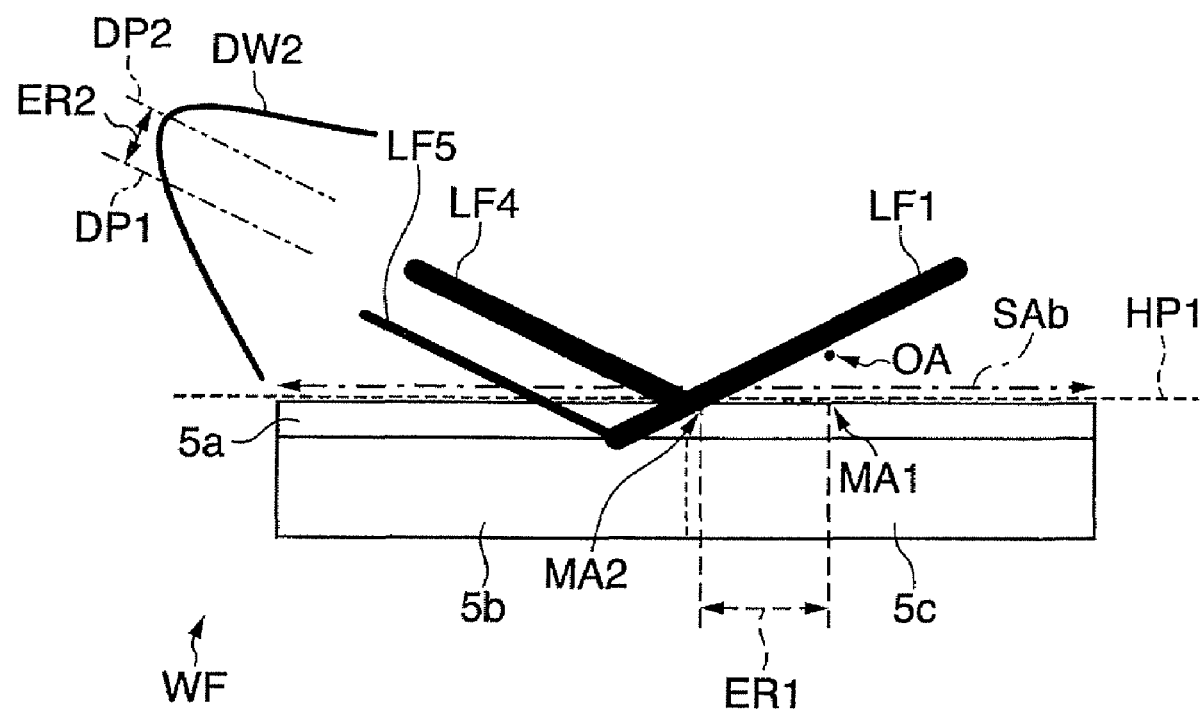
FIG. 25 is a view showing a problem to be solved by the present invention.
Figure 26:
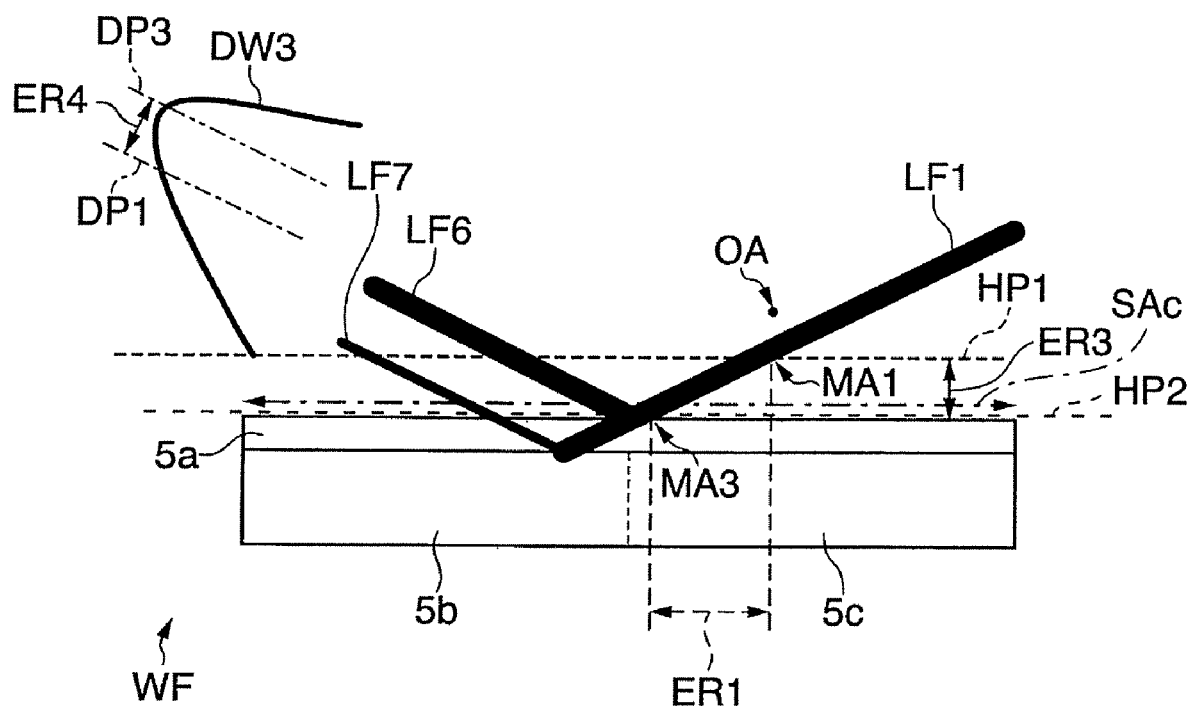
FIG. 26 is a view showing still another problem to be solved by the present invention.

A semiconductor device manufacturing process using an exposure apparatus according to the present invention will be explained next. FIG. 23 is a flowchart illustrating a sequence of the overall semiconductor device manufacturing process. In step S91 (circuit design), a circuit of a semiconductor device is designed. In step S92 (mask fabrication), a mask (also called an original or a reticle) is fabricated, on the basis of the designed circuit pattern. In step S93 (wafer manufacture and preparation), a wafer (also called a substrate) is manufactured using a material such as silicon. In step S94 (wafer process), called a pre-process, the above-described exposure apparatus forms an actual circuit on the wafer by lithography using the mask and wafer. In step S95 (assembly), called a post-process, a semiconductor chip is formed using the wafer manufactured in step S94. This step includes an assembly step (dicing and bonding) and a packaging step (chip encapsulation). In step S96 (inspection), the semiconductor device manufactured in step S95 undergoes inspections, such as an operation confirmation test and a durability test. After these steps, the semiconductor device is completed and shipped, in step S97.

The wafer process in step S94 includes an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of exposing, using the above-described exposure apparatus, the wafer having undergone the resist processing step to light via the mask pattern to form a latent pattern on the resist, a development step of developing the latent pattern formed on the resist of the wafer exposed in the exposure step, an etching step of etching portions other than the latent pattern developed in the development step, and a resist removal step of removing any unnecessary resist remaining after etching. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation, so as to encompass all such modifications and equivalent structures and functions.

What is claimed is:

1. A surface level detection method comprising:
a first level measurement step of measuring a level of a surface of a substrate having a plurality of shot regions;
a position measurement step of measuring a position along the surface of the substrate;
a first movement step of moving the substrate in at least a vertical direction on the basis of the measurement result obtained in the first level measurement step and the measurement result obtained in the position measurement step; and
a second level measurement step of measuring the level of the surface of the substrate after the first movement step,
wherein each of the plurality of shot regions has a measurement region,
wherein, in the first movement step, the substrate is moved such that (i) a relative position of the measurement region of each of the plurality of shot regions and (ii) each of the plurality of shot regions along the surface is constant, and wherein, in the second level measurement step, the measurement region of each of the plurality of shot regions is measured.

2. A surface level detection method comprising:

a first level measurement step of measuring a level of a surface of a substrate having a plurality of shot regions;

a position measurement step of measuring a position along the surface of the substrate;

a first movement step of moving the substrate in at least a vertical direction on the basis of the measurement result obtained in the first level measurement step and the measurement result obtained in the position measurement step; and a second level measurement step of measuring the level of the surface of the substrate after the first movement step, wherein each of the plurality of shot regions has a measurement region, wherein, in the first movement step, the substrate is moved such that (i) a relative position of the measurement region of each of the plurality of shot regions and (ii) a focal plane in the vertical direction is constant, and wherein, in the second level measurement step, the measurement region of each of the plurality of shot regions is measured.

3. The method according to claim 1, further comprising:

a second movement step of moving the substrate on the basis of the measurement result obtained in the second level measurement step; and a third level measurement step of measuring the level of the surface of the substrate after the second movement step.

4. The method according to claim 2, further comprising:

a second movement step of moving the substrate on the basis of the measurement result obtained in the second level measurement step; and a third level measurement step of measuring the level of the surface of the substrate after the second movement step.

5. An exposure apparatus comprising:

an optical system to project exposure light applied to a mask, on which a pattern is formed, onto a substrate; and a positioning apparatus to support and to position the substrate using a surface level detection method defined in claim 1.

6. An exposure apparatus comprising:

an optical system to project exposure light applied to a mask, on which a pattern is formed, onto a substrate; and a positioning apparatus to support and to position the substrate using a surface level detection method defined in claim 2.

* * * * *